United States Patent
Huo et al.

(10) Patent No.: US 11,094,712 B2
(45) Date of Patent: Aug. 17, 2021

(54) THREE-DIMENSIONAL MEMORY DEVICE WITH SUPPORT STRUCTURES IN SLIT STRUCTURES AND METHOD FOR FORMING THE SAME

(71) Applicant: YANGTZE MEMORY TECHNOLOGIES CO., LTD., Wuhan (CN)

(72) Inventors: Zongliang Huo, Wuhan (CN); Haohao Yang, Wuhan (CN); Wei Xu, Wuhan (CN); Ping Yan, Wuhan (CN); Pan Huang, Wuhan (CN); Wenbin Zhou, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 35 days.

(21) Appl. No.: 16/670,579

(22) Filed: Oct. 31, 2019

(65) Prior Publication Data

US 2020/0395374 A1 Dec. 17, 2020

Related U.S. Application Data

(63) Continuation of application No. PCT/CN2019/102114, filed on Aug. 23, 2019.

(30) Foreign Application Priority Data

Jun. 17, 2019 (CN) .......................... 201910522875.0

(51) Int. Cl.
*H01L 27/11582* (2017.01)
*H01L 23/522* (2006.01)
(Continued)

(52) U.S. Cl.
CPC .... *H01L 27/11582* (2013.01); *H01L 23/5226* (2013.01); *H01L 23/5283* (2013.01); *H01L 27/1157* (2013.01); *H01L 27/11565* (2013.01)

(58) Field of Classification Search
None
See application file for complete search history.

(56) References Cited

U.S. PATENT DOCUMENTS

| 9,754,963 B1 | 9/2017 | Kawamura et al. |
| 10,050,054 B2 | 8/2018 | Zhang et al. |

(Continued)

FOREIGN PATENT DOCUMENTS

| CN | 104659033 A | 5/2015 |
| CN | 105097822 A | 11/2015 |

(Continued)

OTHER PUBLICATIONS

Machine-generated English translation of CN108538841, total pp. 12 (Year: 2018).*

(Continued)

*Primary Examiner* — Bo B Jang
(74) *Attorney, Agent, or Firm* — Bayes PLLC

(57) ABSTRACT

Embodiments of structure and methods for forming a three-dimensional (3D) memory device are provided. In an example, a 3D memory device includes a stack structure and at least one source structure extending vertically and laterally and dividing the stack structure into a plurality of block regions. The stack structure may include a plurality of conductor layers and a plurality of insulating layers interleaved over a substrate. The at least one source structure includes at least one support structure extending along the vertical direction to the substrate, the at least one support structure being in contact with at least a sidewall of the respective source structure.

20 Claims, 20 Drawing Sheets

(51) Int. Cl.
  *H01L 27/11565* (2017.01)
  *H01L 27/1157* (2017.01)
  *H01L 23/528* (2006.01)

(56) References Cited

U.S. PATENT DOCUMENTS

| | | | |
|---|---|---|---|
| 10,269,820 | B1 | 4/2019 | Kaminaga |
| 2008/0164491 | A1 | 7/2008 | Liu et al. |
| 2012/0094453 | A1 | 4/2012 | Han et al. |
| 2012/0098049 | A1 | 4/2012 | Moon et al. |
| 2013/0168800 | A1 | 7/2013 | Shim et al. |
| 2014/0217488 | A1 | 8/2014 | Thimmegowda et al. |
| 2014/0284697 | A1 | 9/2014 | Wang et al. |
| 2015/0318301 | A1 | 11/2015 | Lee et al. |
| 2015/0357341 | A1 | 12/2015 | Yeh et al. |
| 2016/0126252 | A1 | 5/2016 | Tsuda et al. |
| 2016/0336338 | A1 | 11/2016 | Song et al. |
| 2016/0358933 | A1 | 12/2016 | Rabkin et al. |
| 2017/0047334 | A1 | 2/2017 | Lu et al. |
| 2017/0117289 | A1 | 4/2017 | Liu et al. |
| 2017/0309339 | A1 | 10/2017 | Hsiung et al. |
| 2018/0097009 | A1 | 4/2018 | Zhang et al. |
| 2018/0233513 | A1 | 8/2018 | Zhang et al. |
| 2018/0366483 | A1 | 12/2018 | Choi |
| 2019/0067314 | A1 | 2/2019 | Lu et al. |
| 2019/0096899 | A1 | 3/2019 | Tagami et al. |
| 2020/0185408 | A1 | 6/2020 | Song et al. |

FOREIGN PATENT DOCUMENTS

| | | |
|---|---|---|
| CN | 107810554 A | 3/2018 |
| CN | 108511454 A | 9/2018 |
| CN | 108538841 A | 9/2018 |
| CN | 108831887 A | 11/2018 |
| CN | 108987405 A | 12/2018 |
| CN | 109314118 A | 2/2019 |
| CN | 109346477 A | 2/2019 |
| CN | 109690776 A | 4/2019 |
| CN | 109698201 A | 4/2019 |
| CN | 109727995 A | 5/2019 |
| CN | 109786382 A | 5/2019 |
| CN | 110112134 A | 8/2019 |
| WO | 2019022814 A1 | 1/2019 |

OTHER PUBLICATIONS

International Search Report issued in corresponding International Application No. PCT/CN2019/102121, dated Mar. 18, 2020, 5 page.
Written Opinion of the International Searching Authority issued in corresponding International Application No. PCT/CN2019/102121, dated Mar. 18, 2020, 5 page.
International Search Report issued in corresponding International Application No. PCT/CN2019/102114, dated Mar. 25, 2020, 4 pages.
Written Opinion of the International Searching Authority issued in corresponding International Application No. PCT/CN2019/102114, dated Mar. 25, 2020, 5 pages.
International Search Report issued in corresponding International Application No. PCT/CN2019/102133, dated Mar. 20, 2020, 5 page.
Written Opinion of the International Searching Authority issued in corresponding International Application No. PCT/CN2019/102133, dated Mar. 20, 2020, 5 page.
International Search Report issued in corresponding International Application No. PCT/CN2019/102116, dated Mar. 18, 2020, 4 page.
Written Opinion of the International Searching Authority issued in corresponding International Application No. PCT/CN2019/102116, dated Mar. 18, 2020, 5 page.

* cited by examiner

300

500

US 11,094,712 B2

THREE-DIMENSIONAL MEMORY DEVICE WITH SUPPORT STRUCTURES IN SLIT STRUCTURES AND METHOD FOR FORMING THE SAME

CROSS-REFERENCE TO RELATED APPLICATIONS

This application is continuation of International Application No. PCT/CN2019/102114, filed on Aug. 23, 2019, entitled "THREE-DIMENSIONAL MEMORY DEVICE WITH SUPPORT STRUCTURES IN SLIT STRUCTURES AND METHOD FOR FORMING THE SAME," which claims the benefit of priority to Chinese Patent Application No. 201910522875.0, filed on Jun. 17, 2019, both of which are incorporated herein by reference in their entireties. This application is also related to U.S. application Ser. No. 16/670,571, filed on Oct. 31, 2019, entitled "METHODS FOR FORMING THREE-DIMENSIONAL MEMORY DEVICE WITH SUPPORT STRUCTURE AND RESULTING THREE-DIMENSIONAL MEMORY DEVICE," U.S. application Ser. No. 16/670,586, filed on Oct. 31, 2019, entitled "THREE-DIMENSIONAL MEMORY DEVICE WITHOUT GATE LINE SLITS AND METHOD FOR FORMING THE SAME," and U.S. application Ser. No. 16/670,594, filed on Oct. 31, 2019, entitled "THREE-DIMENSIONAL MEMORY DEVICE WITH SUPPORT STRUCTURES IN GATE LINE SLITS AND METHODS FOR FORMING THE SAME," all of which are hereby incorporated by reference in their entireties.

BACKGROUND

Embodiments of the present disclosure relate to three-dimensional (3D) memory devices with support structures in gate line slits (GLSs), and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a stack structure and at least one source structure extending vertically and laterally and dividing the stack structure into a plurality of block regions. The stack structure may include a plurality of conductor layers and a plurality of insulating layers interleaved over a substrate. The at least one source structure includes at least one support structure extending along the vertical direction to the substrate, the at least one support structure being in contact with at least a sidewall of the respective source structure.

In another example, a method for forming a 3D memory device includes forming a dielectric stack including interleaved a plurality of initial insulating layers and a plurality of initial sacrificial layers over a substrate, forming at least one slit structure extending vertically and laterally in the dielectric stack, the at least one slit structure dividing the dielectric stack into a plurality of block regions, wherein the at least one slit structure comprises at least one support structure extending along the vertical direction to the substrate and being in contact with at least one adjacent block region and forming a source structure in each of the at least one slit structure.

In still another example, a method for forming a 3D memory device includes forming a dielectric stack including interleaved a plurality of initial insulating layers and a plurality of initial sacrificial layers over a substrate, forming at least one support structure extending along the vertical direction to the substrate in each of a plurality of source regions, forming a plurality of slit structures extending vertically and laterally in the dielectric stack, the plurality of slit structures dividing the dielectric stack into a plurality of block regions, wherein the plurality of slit structure comprises the at least one support structure, and wherein the at least one support structure is in contact with at least one adjacent block region and forming a source structure in each of the at least one slit structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
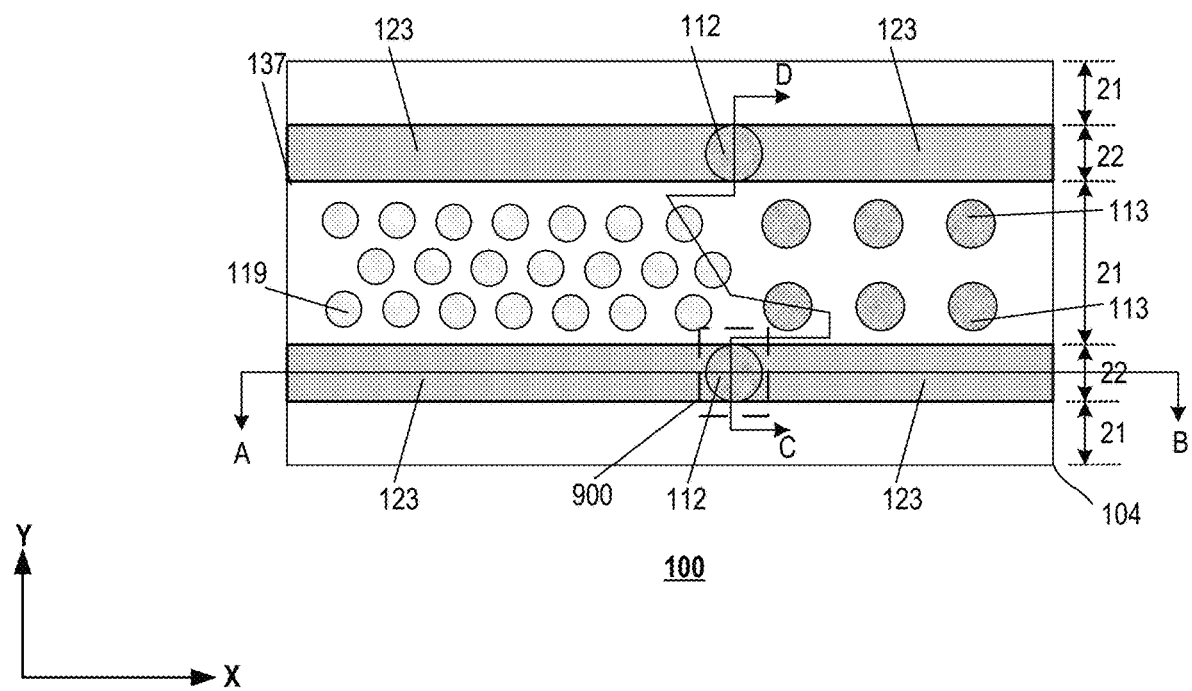
FIG. 1A illustrates a plan view of an exemplary 3D memory device with support structures in slit structures, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. The process to form an existing 3D NAND memory device often includes the following operations. First, a stack structure of a plurality of interleaved sacrificial layers and insulating layers are formed over a substrate. A channel hole is formed extending in the stack structure. The bottom of the channel hole is etched to form a recess in the substrate. An epitaxial portion is formed at the bottom of the channel hole by selective epitaxial growth. A semiconductor channel, conductively connected to the epitaxial portion, is formed in the channel hole. The sacrificial layers can be removed and replaced with conductor layers. The conductor layers function as word lines in the 3D NAND memory device.

An existing 3D NAND memory device often includes a plurality of memory blocks. Adjacent memory blocks are often separated by a gate line slit (GLS), in which an array common source (ACS) is formed. In the fabrication method to form the existing 3D NAND memory device, the feature size of the GLS is susceptible to fluctuation, potentially affecting the performance of the 3D NAND memory device.

The present disclosure provides 3D memory devices (e.g., 3D NAND memory devices) with support structures in a slit structure (e.g., a GLS), and methods for forming the 3D memory devices. A 3D memory device employs one or more support structures being in contact with at least a sidewall of a slit structure. For example, a width of the support structure is equal to or greater than a width of a slit structure. Thus, the support structures provide support to the entire structure of the 3D memory device during the formation of conductor layers/portions and source contacts. The 3D memory device is then less susceptible to deformation or damages during the fabrication process. In some embodiments, the support structures are filled with insulating materials include a different material than the sacrificial layers, such as silicon dioxide or polysilicon, so that the support structure has little or no damages during the gate-replacement process in which the sacrificial layers are etched away. By applying the structures and methods of the present disclosure, adjacent memory blocks are in contact with each other through the support structures during the formation of slit structures and source contacts, the 3D memory device is thus less likely to deform during the fabrication process. The feature size of the slit structure is less susceptible to fluctuation.

Figure 1B:
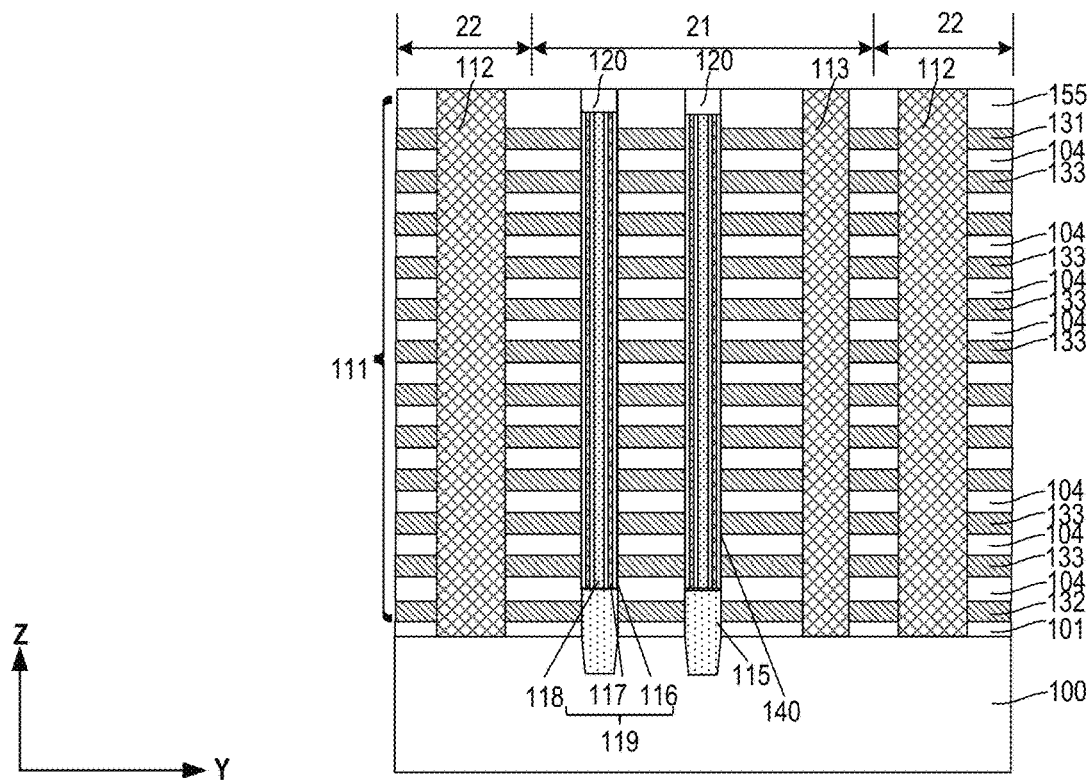
FIG. 1B illustrates a cross-sectional view of the 3D memory device illustrated in FIG. 1A along the C-D direction, according to some embodiments of the present disclosure.
Figure 1C:
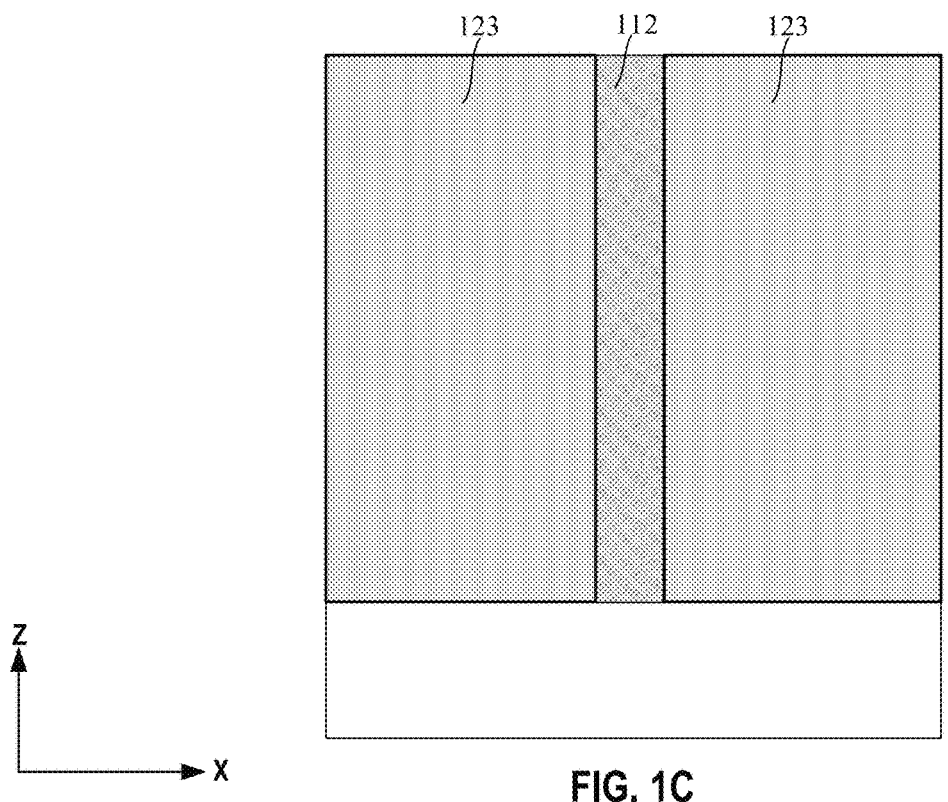
FIG. 1C illustrates a cross-sectional view of the 3D memory device illustrated in FIG. 1A along the A-B direction, according to some embodiments of the present disclosure.

FIG. 1A illustrates a plan view of an exemplary 3D memory device 150, according to some embodiments. FIG. 1B illustrates a cross-sectional view of the 3D memory device 150 shown in FIG. 1A along the C-D direction. FIG. 1C illustrates a cross-sectional view of the 3D memory device 150 shown in FIG. 1A along the A-B direction. As shown in FIG. 1A, 3D memory device 150 may be divided into a core region and a staircase region (not shown), e.g., along the y-direction. Channel structures and support pillars can be formed in the core region. Staircases and electric connection between conductor layers and outside circuits (e.g., contact plugs) can be formed in the staircase region. The core region may include one or more source regions 22 and block region 21 extending along the x-direction. A source structure may be formed in each source region 22. A channel structure may be formed in each block region 21.

As shown in FIGS. 1A-1C, 3D memory device 150 may include a substrate 100, a buffer oxide layer 101, and a stack structure 111 over buffer oxide layer 101. In block region 21, stack structure 111 may include a plurality of conductor layers and a plurality of insulating layers 104 interleaved over buffer oxide layer 101. In some embodiments, the plurality of conductor layers may include a top conductor layer 131 having a plurality of top select conductor layers, a bottom conductor layer 132 having a plurality of bottom select conductor layers, and control conductor layers 133 between top conductor layer 131 and bottom conductor layer 132. Stack structure 111 may also include a dielectric cap layer 155 covering the plurality of conductor layers (i.e., 131-133) and insulating layers 104. In block region 21, 3D memory device 150 may also include a plurality of channel structures 140 extending from a top surface of dielectric cap layer 155 into substrate 100 along a vertical direction (e.g., the z-direction) and support pillars 113 extending from a top surface of dielectric cap layer 155 to substrate 100 along a vertical direction (e.g., the z-direction). Each channel structure 140 may include an epitaxial portion 115 at a bottom portion, a drain structure 120 at a top portion, and a semiconductor channel 119 between epitaxial portion 115 and drain structure 120. Semiconductor channel 119 may include a memory film 116, a semiconductor layer 117, and a dielectric core 118. Epitaxial portion 115 may contact and be conductively connected to substrate 100, and semiconductor channel 119 may contact and be conductively connected to drain structure 120 and epitaxial portion 115. A plurality of memory cells may be formed by semiconductor channels 119 and control conductor layers 133.

A source structure may be formed in source region 22 to extend along the x-direction in the core region and the staircase region (not shown). The source structure may include a source contact 123 in an insulating structure 137. The source structures may extend vertically through stack structure 111 and contact substrate 100, applying a source voltage on the memory cells through substrate 100. 3D memory device 150 may include one or more support structures 112 aligned along the x-direction and being in contact with at least a sidewall of the respective source structure. In some embodiments, support structure 112 is in contact with at least one adjacent block region 21 through its contact/connection with the sidewall of the source structure. For example, each one of support structure 112 is in contact with both sidewalls of the respective source region 22. In some embodiments, each support structure 112 is in contact with adjacent block regions 21 through its contact/connection with the source structure. Support structure 112 may provide support to 3D memory device 150 during the formation of the source structures and conductor layers (e.g., 131-133). The 3D memory device is thus less likely to deform during the fabrication process. The feature size of the slit structure is less susceptible to fluctuation.

Substrate 100 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 100 is a thinned substrate (e.g., a semiconductor layer), which was thinned by grinding, etching, chemical mechanical polishing (CMP), or any combination thereof. In some embodiments, substrate 100 includes silicon.

Channel structures 140 may form an array and may each extend vertically above substrate 100. Channel structure 140 may extend through a plurality of pairs each including a conductor layer (e.g., 131, 132, or 133) and an insulating layer 104 (referred to herein as "conductor/insulating layer pairs"). In some embodiments, buffer oxide layer 101 is formed between substrate 100 and stack structure 111. At least on one side along a horizontal direction (e.g., x-direction and/or y-direction), stack structure 111 can include a staircase structure, e.g., in a staircase region (not shown). The number of the conductor/insulating layer pairs in stack structure 111 (e.g., 32, 64, 96, or 128) determines the number of memory cells in 3D memory device 150. In some embodiments, conductor layers (e.g., 131-133) and insulating layers 104 in stack structure 111 are alternatingly arranged along the vertical direction in block region 21. Conductor layers (e.g., 131-133) can include conductive materials including, but not limited to, tungsten (W), cobalt (Co), copper (Cu), aluminum (Al), polysilicon, doped silicon, silicides, or any combination thereof. Insulating layers 104 can include dielectric materials including, but not limited to, silicon oxide, silicon nitride, silicon oxynitride, or any combination thereof. In some embodiments, buffer oxide layer 101 and dielectric cap layer 155 each includes a dielectric material such as silicon oxide. In some embodiments, top conductor layer 131 includes a plurality of top select conductor layers, which function as the top select gate electrodes. Control conductor layers 133 may function as select gate electrodes and form memory cells with intersecting channel structures 140. In some embodiments, bottom conductor layer 132 includes a plurality of bottom select conductor layers, which function as the bottom select gate electrodes. Top select gate electrodes and bottom select gate electrodes can respectively be applied with desired voltages to select a desired memory block/finger/page.

As shown in FIG. 1B, channel structure 140 can include a semiconductor channel 119 extending vertically through stack structure 111. Semiconductor channel 119 can include a channel hole filled with a channel-forming structure, e.g., semiconductor materials (e.g., as a semiconductor layer 117) and dielectric materials (e.g., as a memory film 116). In some embodiments, semiconductor layer 117 includes silicon, such as amorphous silicon, polysilicon, or single crystalline silicon. In some embodiments, memory film 116 is a composite layer including a tunneling layer, a memory layer (also known as a "charge trap layer"), and a blocking layer. The remaining space of the channel hole of semiconductor channel 119 can be partially or fully filled with a dielectric core 118 including dielectric materials, such as silicon oxide. Semiconductor channel 119 can have a cylinder shape (e.g., a pillar shape). Dielectric core 118, semiconductor layer 117, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 140 further includes an epitaxial portion 115 (e.g., a semiconductor plug) in the lower portion (e.g., at the lower end of bottom) of channel structure 140. As used herein, the "upper end" of a component (e.g., channel structure 140) is the end farther away from substrate 100 in the vertical direction, and the "lower end" of the component (e.g., channel structure 140) is the end closer to substrate 100 in the vertical direction when substrate 100 is positioned in the lowest plane of 3D memory device 150. Epitaxial portion 115 can include a semiconductor material, such as silicon, which is epitaxially grown from substrate 100 in any suitable directions. It is understood that in some embodiments, epitaxial portion 115 includes single crystalline silicon, the same material as substrate 100. In other words, epitaxial portion 115 can include an epitaxially-grown semiconductor layer grown from substrate 100. Epitaxial portion 115 can also include a different material than substrate 100. In some embodiments, epitaxial portion 115 includes at least one of silicon, germanium, and silicon germanium. In some embodiments, part of epitaxial portion 115 is above the top surface of substrate 100 and in contact with semiconductor channel 119. Epitaxial portion 115 may be conductively connected to semiconductor channel 119. In some embodiments, a top surface of epitaxial portion 115 is located between a top surface and a bottom surface of a bottom insulating layer 104 (e.g., the insulating layer at the bottom of stack structure 11).

In some embodiments, channel structure 140 further includes drain structure 120 (e.g., channel plug) in the upper portion (e.g., at the upper end) of channel structure 140. Drain structure 120 can be in contact with the upper end of semiconductor channel 119 and may be conductively connected to semiconductor channel 119. Drain structure 120 can include semiconductor materials (e.g., polysilicon) or conductive materials (e.g., metals). In some embodiments, drain structure includes an opening filled with Ti/TiN or Ta/TaN as an adhesion layer and tungsten as a conductor material. By covering the upper end of semiconductor channel 119 during the fabrication of 3D memory device 150, drain structure 120 can function as an etch stop layer to prevent etching of dielectrics filled in semiconductor channel 119, such as silicon oxide and silicon nitride.

As shown in FIG. 1A, source region 22 may separate different block regions 21. A plurality of channel structures 140 (e.g., memory cells) can be formed in each block region 21. In some embodiments, source region 22 may extend along the x-direction. The number of source region 22 and a block region 21 (i.e., memory block) may range from 0 to n, n being a positive integer. The number of n should be determined based on the design and/or fabrication of 3D memory device 150 and should not be limited by the embodiments of the present disclosure. For illustrative purposes, n is equal to 2 in the present disclosure.

In some embodiments, a source structure includes a source contact 123 in an insulating structure 137, extending along the x-direction in a respective source region 22. Source contact 123 may be in contact with and form a conductive connection with substrate 100 for applying a source voltage on memory cells. In some embodiments, source contact 123 includes one or more of polysilicon, silicide, germanium, silicon germanium, copper, aluminum, cobalt, and tungsten. In some embodiments, insulating structure 137 includes one or more of silicon oxide, silicon nitride, and silicon oxynitride.

At least one support structure 112 may be formed in contact with one or both sidewalls of the source structure along the y-direction. As shown in FIG. 1A, support structure 112 may be in contact with one or both block regions 21 through its contact/connection with the source structure. In some embodiments, support structure 112 may be in contact with both sidewalls of the respective source structure and thus in contact with both adjacent block regions 21. As shown in FIGS. 1B and 1C, support structure 112 may extend along the z-direction to substrate 100. Support structure 112 may include a single-layer structure or a multi-layer structure. For example, support structure 112 may include a single material or more than one material. In some embodiments, when support structure 112 includes more than one material, the different material may be deposited as a stack in support hole 107, forming a stack structure. The specific number of materials and number of layers of support structure 112 should be determined based on the design and/or fabrication of 3D memory device 150 and should not be limited by the embodiments of the present disclosure.

As shown in FIGS. 1A-1C, the plurality of support structures 112 may divide the source structure into a plurality of source contacts 123 and insulating structures 137 along the x-direction. Source contact 123 (e.g., and respective insulating structure 137) and adjacent source contact 123 (e.g., and respective adjacent insulating structure 137) may be in contact with each other if the support structure 112 in between is in contact with only one block region adjacent to the source structure, and may be disconnected from one another if the support structure 112 in between is in contact with both block regions adjacent to the source structure. In some embodiments, sidewalls of support structure 112 are each in contact with the respective source structure, e.g., along the x-direction.

In some embodiments, support structure 112 includes a suitable support material that has sufficient stiffness and strength and may sustain the gate replacement process for the formation of conductor layers (e.g., 131-133) and conductor portions (e.g., 131 and 132). The support material may include a different material than the sacrificial material (e.g., polysilicon or silicides) so that support structures 112 and support pillars 113 have little or no damages during the gate-replacement process in which the sacrificial layers are etched away. In some embodiments, support structure 112 and support pillar 113 may include the same material, e.g., silicon oxide. In some embodiments, a depth of support structure 112 and support pillar 113 may be the same along the z-axis, e.g., from the top surface of substrate 100 to the top surface of dielectric cap layer 155.

Figure 9:
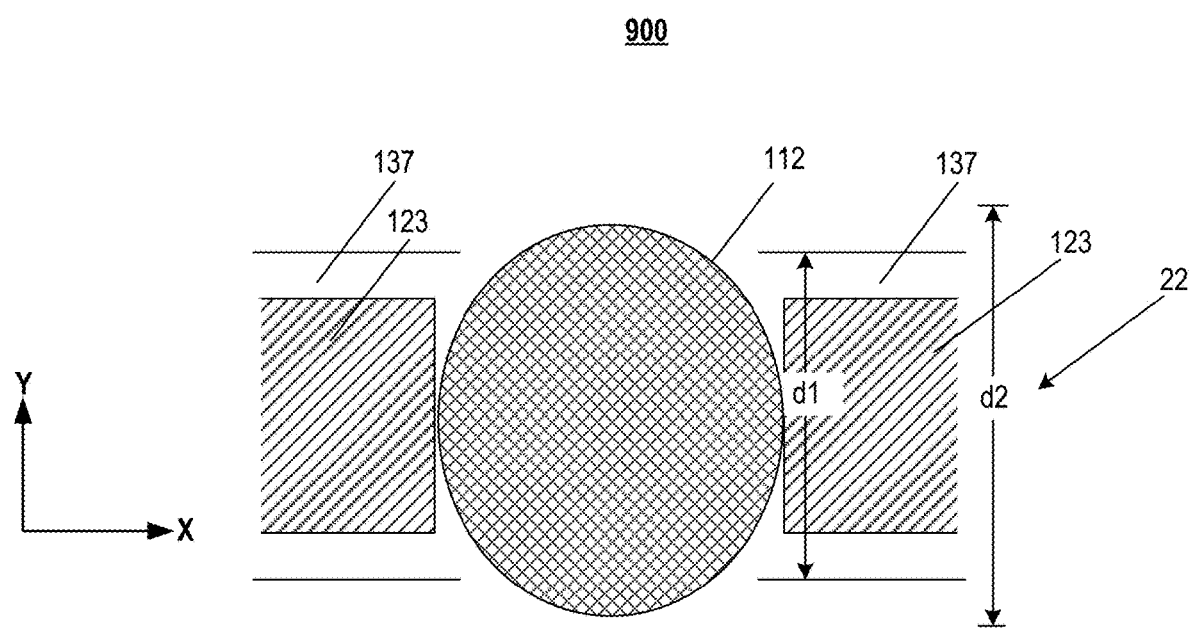
FIG. 9 illustrates an enlarged view of an exemplary support structure, according to some embodiments of the present disclosure.

A width of support structure 112 along the y-direction may be less than, equal to, or greater than the width of the source structure along the y-direction. In some embodiments, the width of support structure 112 is equal to or greater than the width of the source structure along the y-direction. FIG. 9 illustrates an enlarged plan view 900 of support structure 112, adjacent source contacts 123, and adjacent insulating structures 137. As shown in FIG. 9, a width d2 of support structure 112 along the y-direction is less than, equal to, or greater than a width d1 of the respective source structure along the y-direction. Support structure 112 can be in contact with at least one adjacent block region 21 during the fabrication process of the slit structure and the source structure, supporting entire 3D memory device 150 and preventing stack structure 111 from collapsing. In some embodiments, d2 is greater than or equal to d1 and support structure 112 is in contact with both adjacent block regions 21. A cross-sectional shape of support pillar along the x-y plane may include any suitable shape that can be formed in a fabrication process. For example, the cross-sectional shape may include a circular shape, a triangular shape, a rectangular, a pentagonal shape, a hexagonal shape, an arbitrary shape, or a combination thereof. For ease of illustration, support structure 112 has a circular cross-section along the x-y plane. The dimensions (e.g., diameter) of support structure 112 may or may not vary along the z-direction, depending on the structure and fabrication process of 3D memory device 150.

3D memory device 150 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 150 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 100) remains as the substrate of the bonded non-monolithic 3D memory device, and the peripheral device (e.g., including any suitable digital, analog, and/or mixed-signal peripheral circuits used for facilitating the operation of 3D memory device 150, such as page buffers, decoders, and latches; not shown) is flipped and faces down toward the memory array device (e.g., NAND memory strings) for hybrid bonding. It is understood that in some embodiments, the memory array device substrate (e.g., substrate 100) is flipped and faces down toward the peripheral device (not shown) for hybrid bonding, so that in the bonded non-monolithic 3D memory device, the memory array device is above the peripheral device. The memory array device substrate (e.g., substrate 100) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 10A:
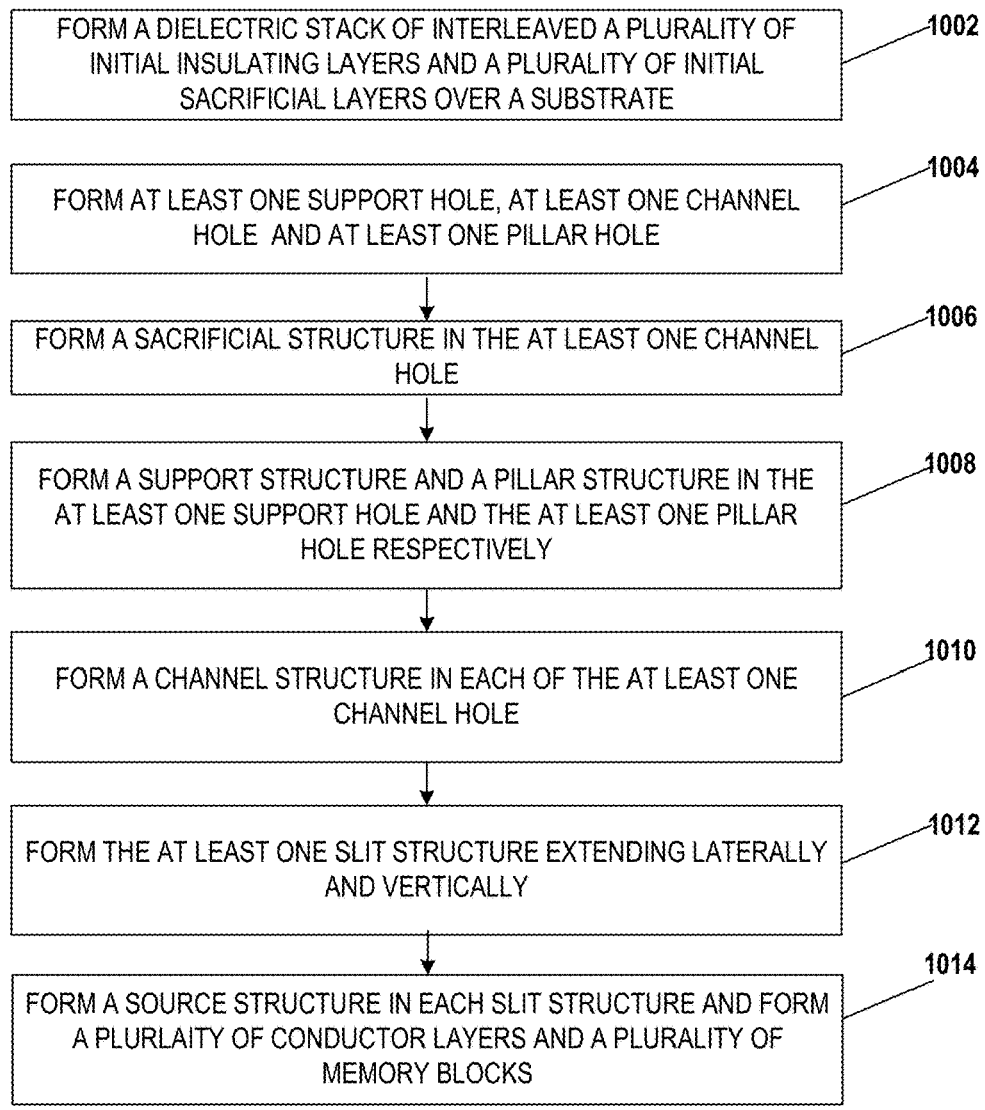
FIG. 10A illustrates a flowchart of an exemplary fabrication process for forming a 3D memory device with support structures in slit structures, according to some embodiments of the present disclosure.

FIGS. 2-7 illustrate a fabrication process to form 3D memory device 150 shown in FIGS. 1A-1C. FIG. 10A is a flowchart of a method 1000 illustrated in FIGS. 2-7. For ease of illustration, same or similar parts are labeled with the same numerals in FIGS. 1-7 of the present disclosure.

Figure 2A:
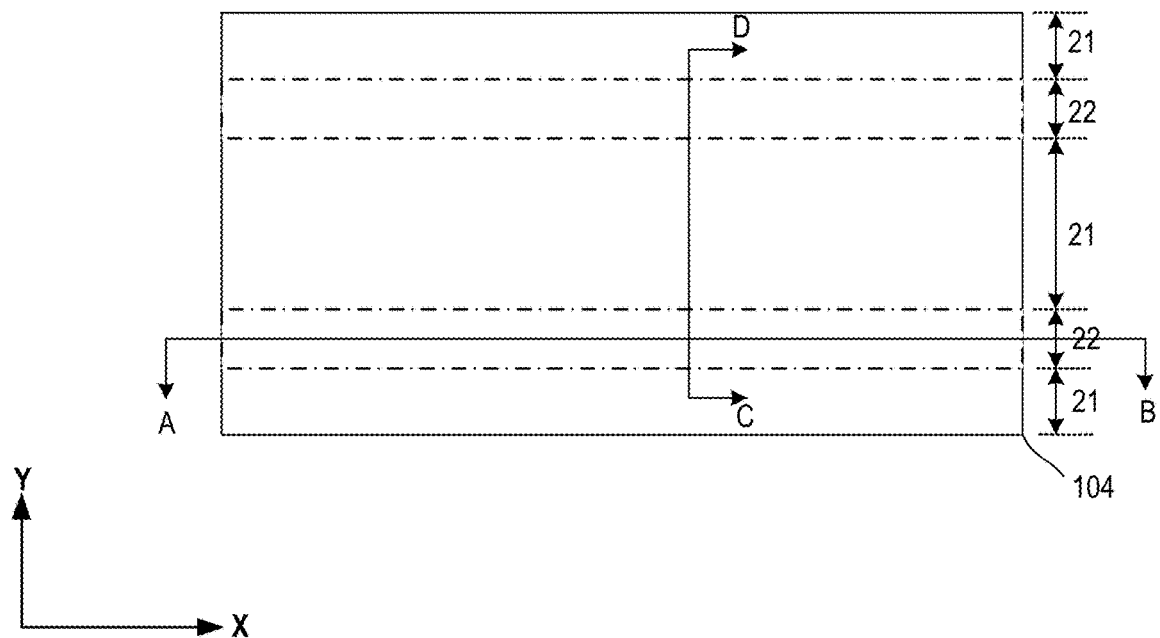
FIG. 2A illustrates a plan view of an exemplary 3D memory device at one stage of a fabrication process, according to some embodiments of the present disclosure.
Figure 2B:
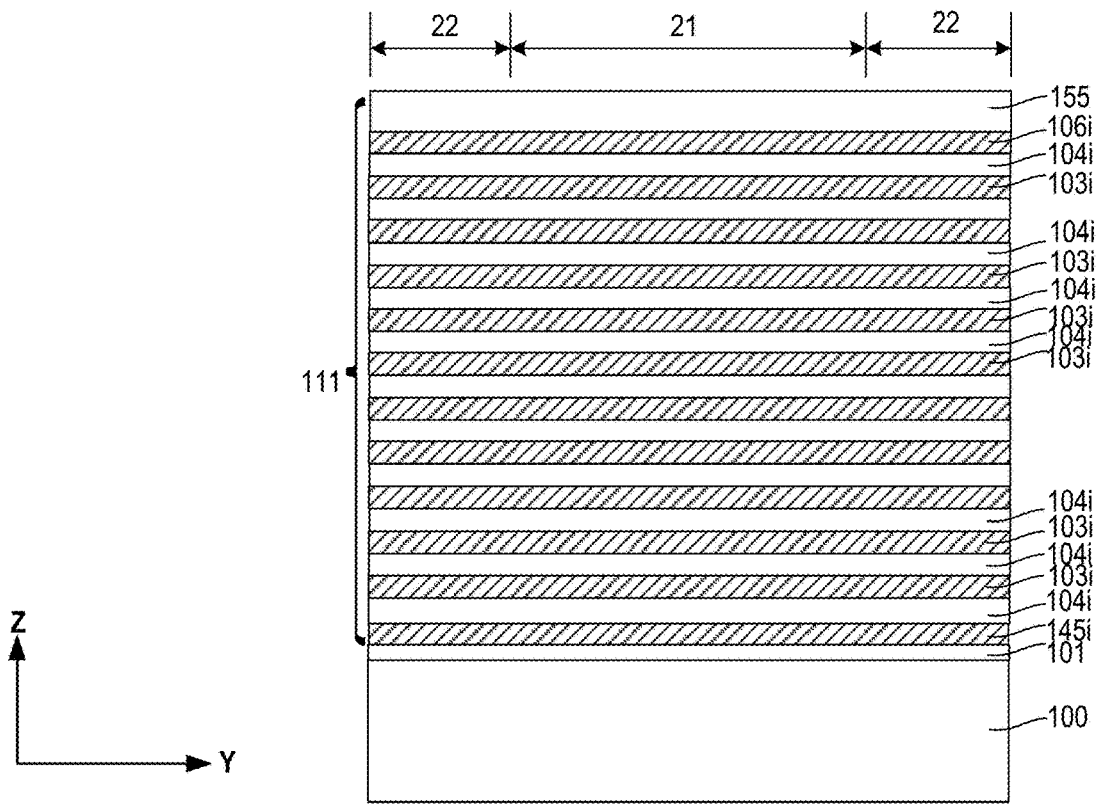
FIG. 2B illustrates a cross-sectional view of the 3D memory device illustrated in FIG. 2A along the C-D direction, according to some embodiments of the present disclosure.
Figure 2C:
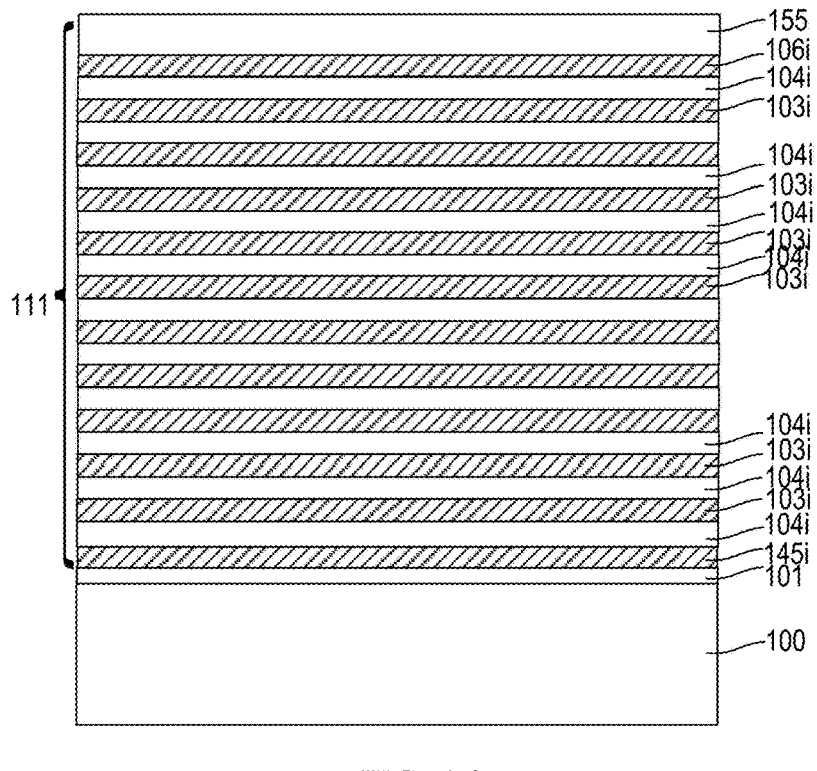
FIG. 2C illustrates a cross-sectional view of the 3D memory device illustrated in FIG. 2A along the A-B direction, according to some embodiments of the present disclosure.

At the beginning of the process, a stack structure of interleaved a plurality of initial insulating layers and a plurality of initial sacrificial layers are formed (Operation 1002). FIGS. 2A-2C illustrate a corresponding structure 200.

As shown in FIGS. 2A-2C, a stack structure 111 having a dielectric stack of interleaved initial insulating layers 104$i$ and initial sacrificial layers 103$i$ is formed over substrate 100. Initial sacrificial layers 103$i$ may be used for subsequent formation of control conductor layers 133. Stack structure 111 may also include a top initial sacrificial layer 106*i* and a bottom initial sacrificial layer 145*i* respectively for subsequent formation of top conductor layer 131 and bottom conductor layer 132. In some embodiments, stack structure 111 includes a dielectric cap layer 155 over initial sacrificial layers (e.g., 103*i*, 145*i*, and 106*i*) and initial insulating layers 104*i*. 3D memory device 150 may include a core region for forming channel structures 140 and support pillars 113, and a staircase region (not shown) for forming staircases and contact plugs on the staircases. The core region may include a block region 21 for forming channel structures 140. In some embodiments, block region 21 may be between a pair of source regions 22.

Stack structure 111 may have a staircase structure. The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over buffer oxide layer 101 until a desired number of layers is reached. In some embodiments, a sacrificial material layer is deposited over buffer oxide layer 101, and an insulating material layer is deposited over the sacrificial material layer, so on and so forth. The sacrificial material layers and insulating material layers can have the same or different thicknesses. In some embodiments, a sacrificial material layer and the underlying insulating material layer are referred to as a dielectric pair. In some embodiments, one or more dielectric pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the sacrificial material layer and the underlying insulating material layer. The etched sacrificial material layers and insulating material layers may form initial sacrificial layers (e.g., 103*i*, 106*i*, and 145*i*) and initial insulating layers 104*i*. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), physical vapor deposition (PVD), and sputtering. In some embodiments, the sacrificial material layers include silicon nitride, and the deposition of insulating material layers include one or more of CVD, PVD, ALD, and sputtering. In some embodiments, the etching of the sacrificial material layers and the insulating material layers include one or more suitable anisotropic etching process, e.g., dry etch.

Figure 3A:
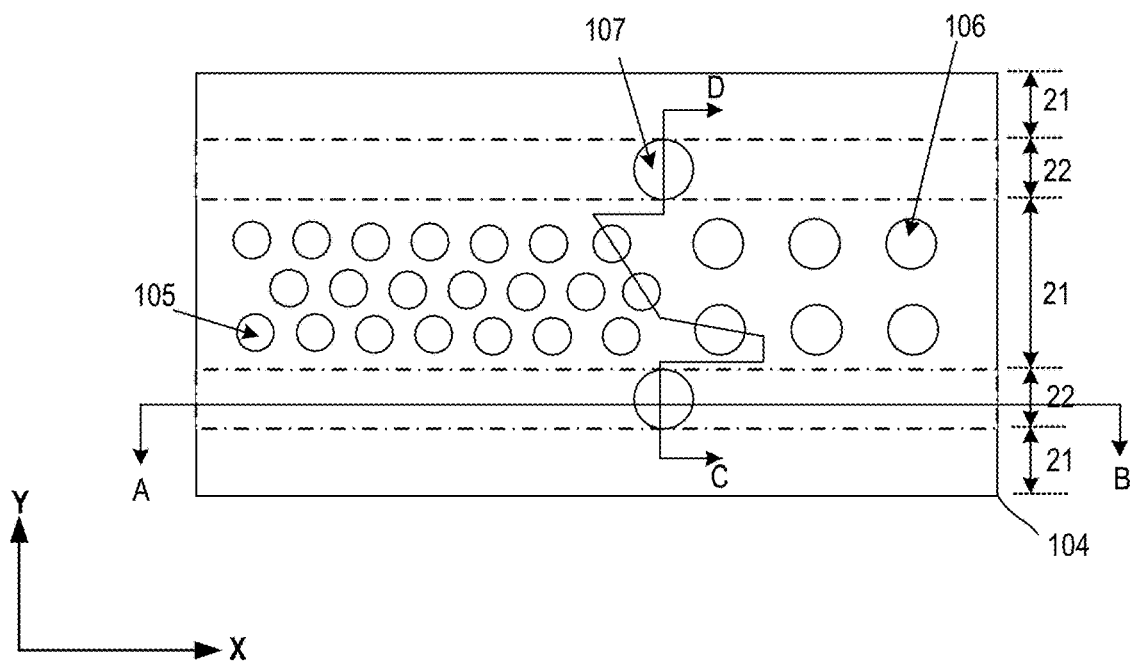
FIG. 3A illustrates a plan view of the exemplary 3D memory device at another stage of the fabrication process, according to some embodiments of the present disclosure.
Figure 3B:
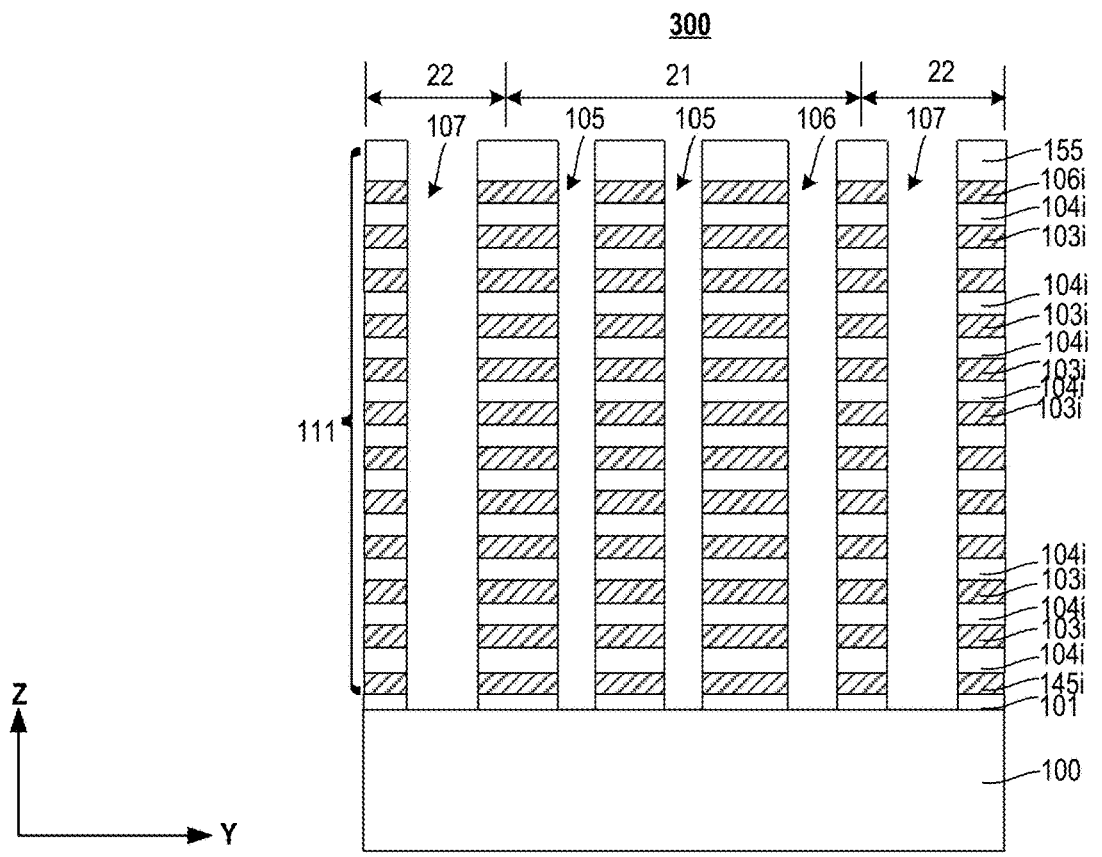
FIG. 3B illustrates a cross-sectional view of the 3D memory device illustrated in FIG. 3A along the C-D direction, according to some embodiments of the present disclosure.
Figure 3C:
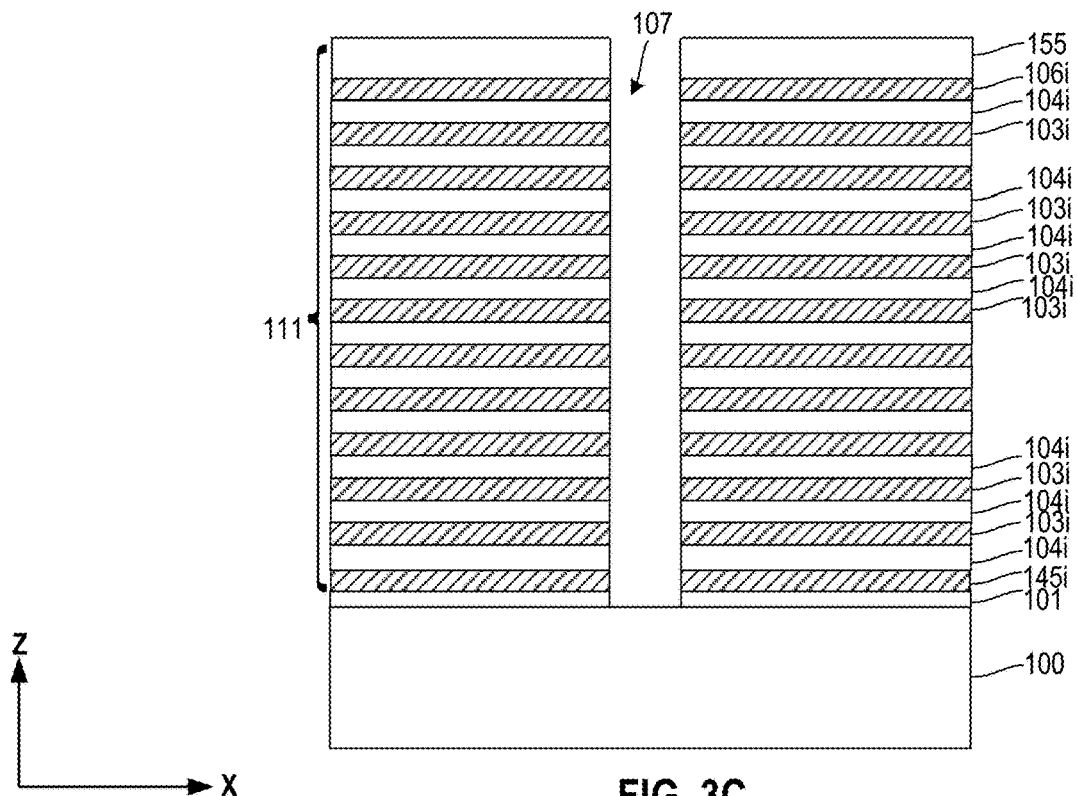
FIG. 3C illustrates a cross-sectional view of the 3D memory device illustrated in FIG. 3A along the A-B direction, according to some embodiments of the present disclosure.

Referring back to FIG. 10A, at least one support hole, at least one channel hole, and at least one pillar hole are formed. In some embodiments, the at least one channel hole and the at least one pillar hole are formed by the same operation that forms the at least one support hole (Operation 1004). FIGS. 3A-3C illustrate a corresponding structure 300. As shown in FIGS. 3A-3C, at least one of support hole 107 is formed in source region 22. In some embodiments, at least one of support hole 107 is formed in each source region 22 along the x-direction, separated from one another. Along the x-direction, a length of support hole 107 may be less than a length L (in FIG. 6) of the source structure to be formed (or the length of source region 22, or the slit structure in which the source structure is formed). The at least one of support hole 107 may have the same or different dimensions. In some embodiments, the at least one of support hole 107 may have the same shapes (e.g., cylinder shapes, such as a pillar shape or cuboid shape) and dimensions along the x-y plane, and same depth along the z-direction. Along the y-direction, a width of support hole 107 may be less than, greater than, or equal to a width of the source structure to be formed. In some embodiments, along the y-direction, the width of support hole 107 is equal to or greater than a width of source region 22. In some embodiments, support hole 107 exposes substrate 100.

In some embodiments, at least one channel hole 105 is formed in the plurality of block regions 21 and at least one pillar hole 106 is formed in the staircase region and/or the plurality of block regions 21. In some embodiments, at least one channel hole 105 and at least one pillar hole 106 are formed in each block region 21 along the x-direction, separated from one another. In some embodiments, a bottom surface of channel hole 105 and a bottom surface of pillar hole 106 each exposes substrate 100. The layout shown in the figures of the present disclosure is for illustrative purposes only and not to scale.

The at least one of support hole 107, the at least one channel hole 105, and the at least one pillar hole 106 may be formed by a suitable patterning process. For example, an etch mask may be used, e.g., a patterned PR layer, over stack structure 111 to expose the areas corresponding to support holes 107, channel holes 105, and pillar hole 106, and an etching process, such as a dry etch and/or wet etch, may be performed to remove portions of stack structure 111 and form the at least one of support hole 107, the at least one channel hole 105 and the at least one pillar hole 106. The PR layer can then be removed.

Figure 4A:
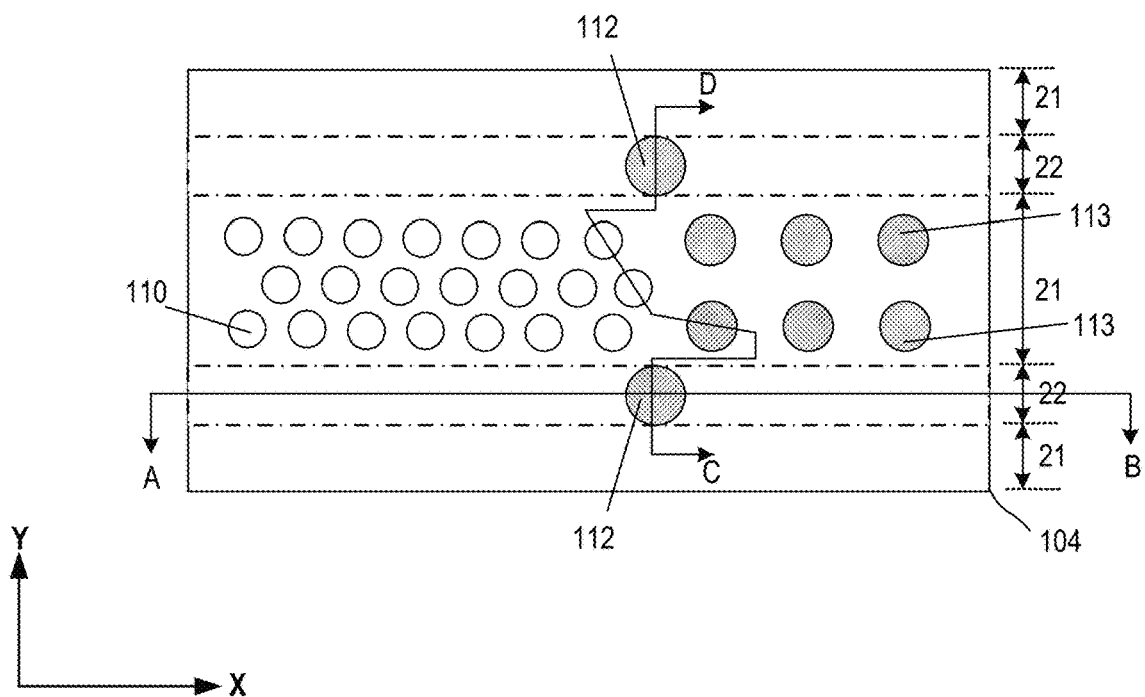
FIG. 4A illustrates a plan view of the exemplary 3D memory device at another stage of the fabrication process, according to some embodiments of the present disclosure.
Figure 4B:
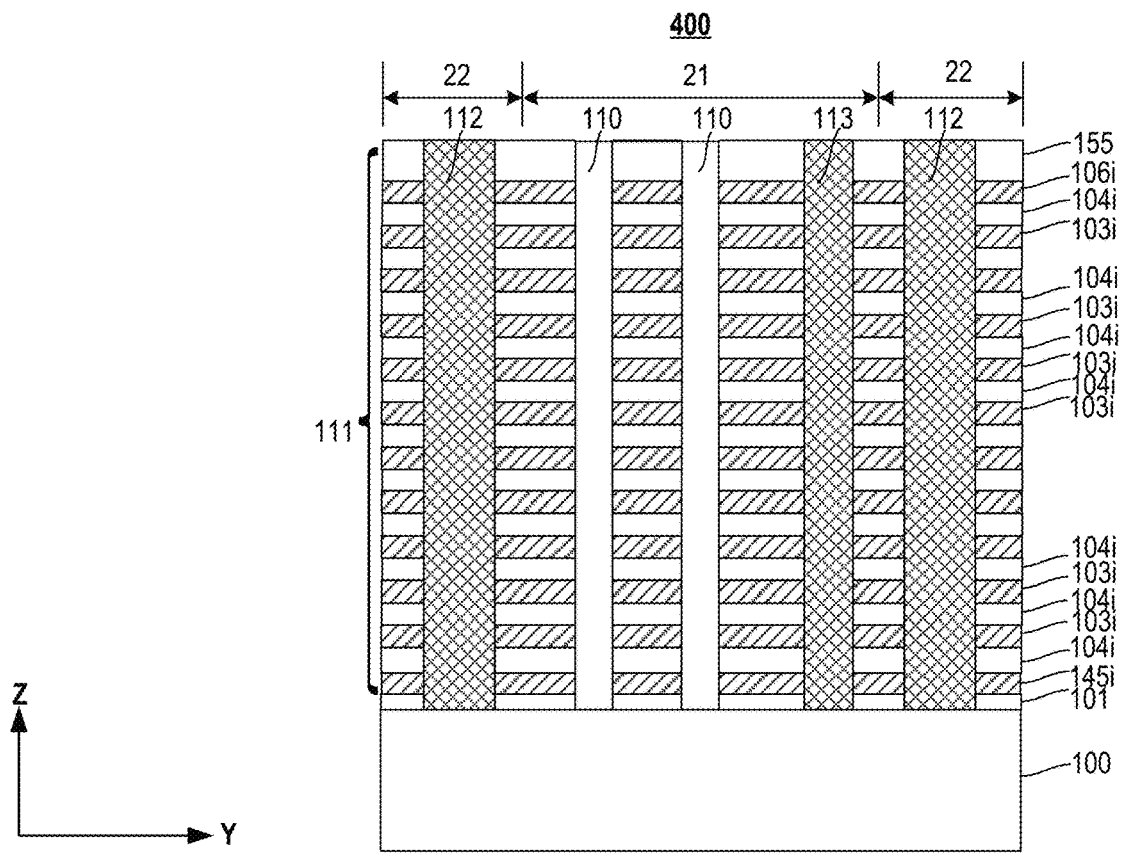
FIG. 4B illustrates a cross-sectional view of the 3D memory device illustrated in FIG. 4A along the C-D direction, according to some embodiments of the present disclosure.
Figure 4C:
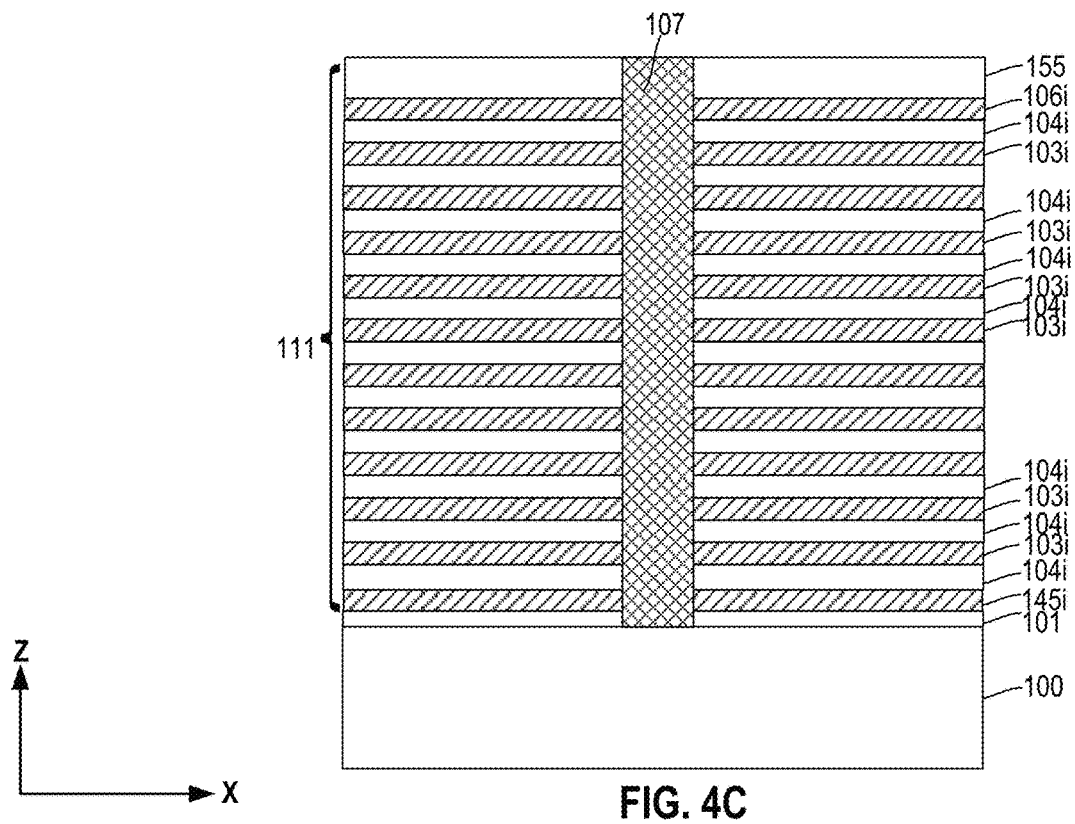
FIG. 4C illustrates a cross-sectional view of the 3D memory device illustrated in FIG. 4A along the A-B direction, according to some embodiments of the present disclosure.
Figure 5A:
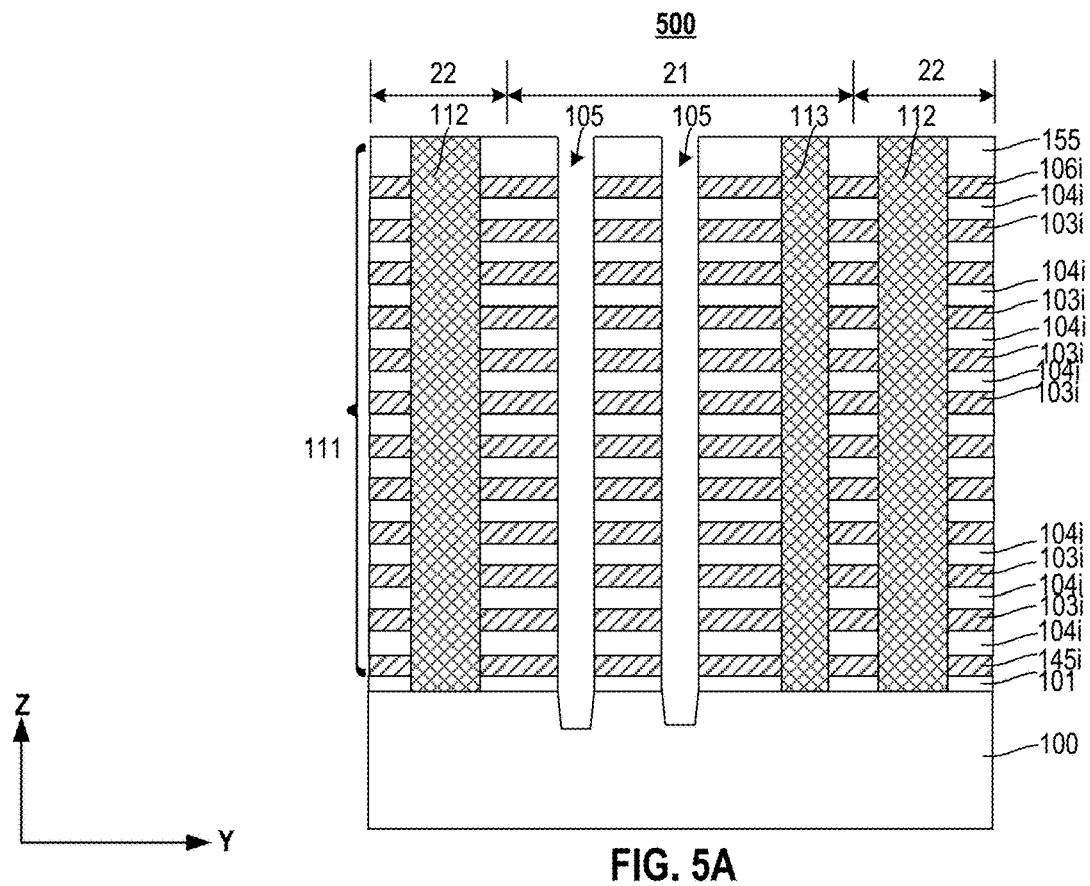
FIG. 5A illustrates another stage of the fabrication process in the cross-sectional view of the 3D memory device illustrated in FIG. 4B, according to some embodiments of the present disclosure.
Figure 5B:
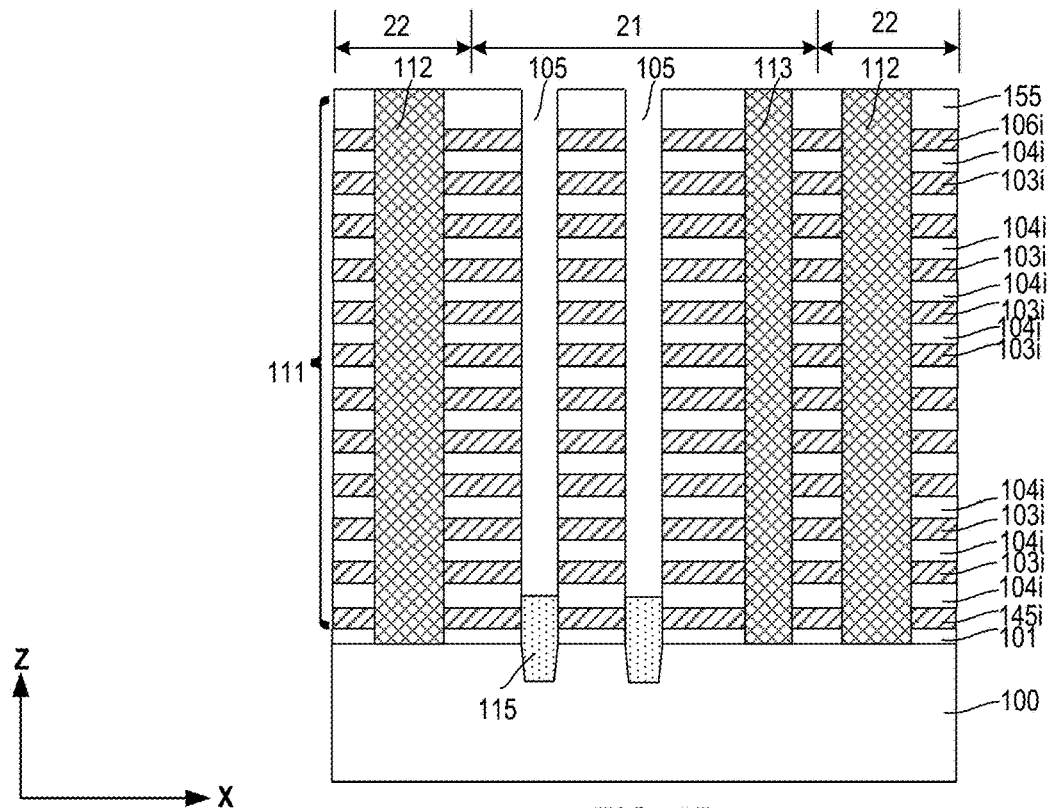
FIG. 5B illustrates another stage of the fabrication process in the cross-sectional view of the 3D memory device illustrated in FIG. 5A, according to some embodiments of the present disclosure.
Figure 5C:
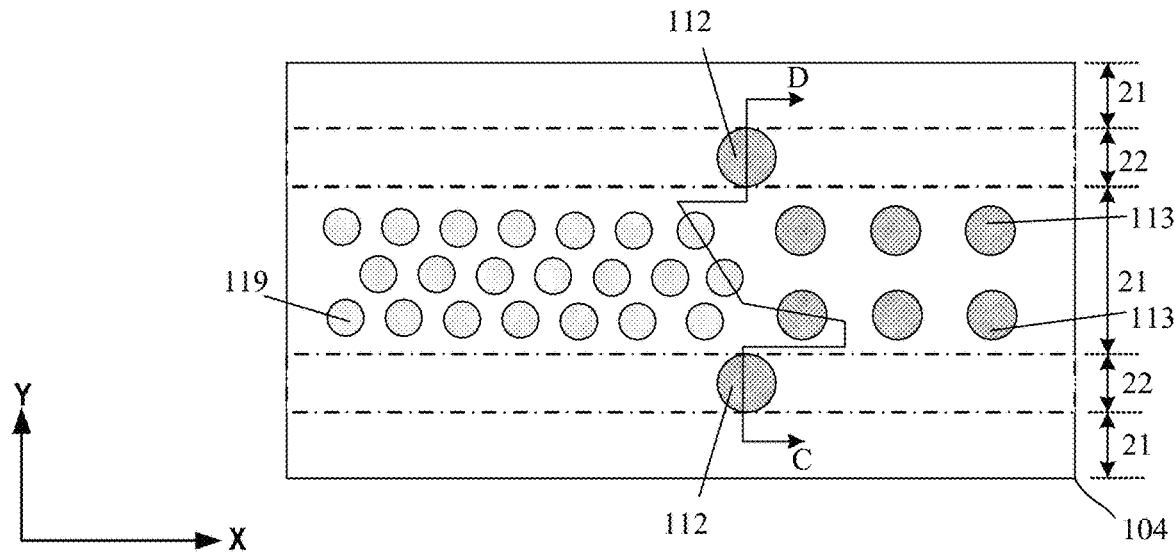
FIG. 5C illustrates a plan view of the exemplary 3D memory device at another stage of the fabrication process, according to some embodiments of the present disclosure.
Figure 5D:
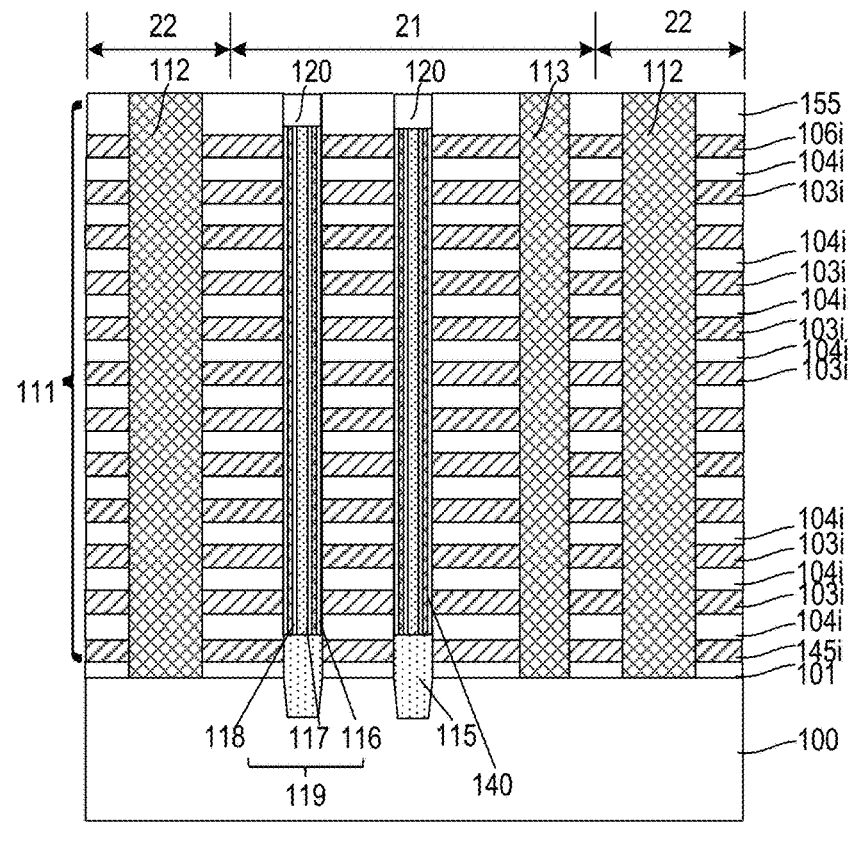
FIG. 5D illustrates a cross-sectional view of the 3D memory device illustrated in FIG. 5A along the C-D direction, according to some embodiments of the present disclosure.

Referring back to FIG. 10A, A sacrificial structure 110 can be formed to fill in the at least one channel hole 105 (Operation 1006). FIGS. 4A-4C illustrate a corresponding structure 400. As shown in FIGS. 4A-4C, channel holes 105 may be filled with sacrificial structure 110 to, e.g., prevent contamination caused by the deposition of a support material when filling support hole 107 and pillar hole 106 with the support material. Sacrificial structure 110 includes a sacrificial material that has one or more of silicon oxide, silicon nitride, and polysilicon, and the deposition process includes one or more of CVD, PVD, sputtering, and ALD. Optionally, a planarization process (e.g., CMP and/or recess etch) is performed to remove any excess material (e.g., sacrificial material) on stack structure 111.

Referring back to FIG. 10A, a support structure and a support pillar are formed in the support hole and the pillar hole respectively (Operation 1008). The support structure and the support pillar can be formed by deposing a support material to the support hole and pillar hole respectively. FIGS. 4A-4C illustrate the corresponding structure 400. As shown in FIGS. 4A-4C, support hole 107 and pillar hole 106 are each filled with the support material to form support structures 112 and support pillars 113. The support material may include a different material than materials of initial sacrificial layers (e.g., 103i, 106i, and 145i) and sacrificial structures 110 so that support structures 112 and support pillars 113 have little or no damages during the gate-replacement process in which the sacrificial layers are etched away and during the process that sacrificial structure 110 is etched away. In some embodiments, support hole 107 and pillar hole 106 may be filled with a single layer of support material. For example, the support material may be formed by deposing the support material into support hole 107 and pillar hole 106. Optionally, a planarization process, e.g., dry/wet etch and/or CMP, is performed to remove any excess material on the top surface of stack structure 111. In some other embodiments, multiple layers of support material may be formed in support hole 107 and pillar hole 106. For example, layers of different materials may be deposited sequentially to fill up support hole 107 and pillar hole 106.

Referring back to FIG. 10A, sacrificial material in the channel hole is removed and channel structures are formed in at least one channel hole (Operation 1010). FIGS. 5A-5D illustrate a corresponding structure 500. As shown in FIGS. 5A-5D, a plurality of channel structures 140 can be formed in each of channel hole 105. In some embodiments, sacrificial structure 110 in channel hole 105 are removed and a plurality of channel holes 105 are re-formed. After removing sacrificial structure 110, substrate 100 is exposed in channel hole 105. A recess region may be formed at the bottom of each channel hole 105 to expose a top portion of substrate 100 by the same etching process that initially forms the channel hole 105 above substrate 100 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as epitaxial portion 115. Optionally, a recess etch (e.g., dry etch and/or wet etch) may be performed to remove excess semiconductor material on the sidewall of channel hole 105 and/or control the top surface of epitaxial portion 115 at a desired position. In some embodiments, the top surface of epitaxial portion 115 is located between the top and bottom surfaces of the bottom initial insulating layer 104i.

In some embodiments, epitaxial portion 115 includes single crystalline silicon is formed by epitaxially grown from substrate 100. In some embodiments, epitaxial portion 115 includes polysilicon formed by a deposition process. The formation of epitaxially-grown epitaxial portion 115 can include, but not limited to, vapor-phase epitaxy (VPE), liquid-phase epitaxy (LPE), molecular-beam epitaxy (MPE), or any combinations thereof. The formation of deposited epitaxial portion 115 may include, but not limited by, CVD, PVD, and/or ALD.

In some embodiments, a semiconductor channel 119 is formed over and contacting epitaxial portion 115 in channel hole 105. Semiconductor channel can include a channel-forming structure that has a memory film 116 (e.g., including a blocking layer, a memory layer, and a tunneling layer), a semiconductor layer 117 formed above and connecting epitaxial portion 115, and a dielectric core 118 filling up the rest of the channel hole. In some embodiments, memory film 116 is first deposited to cover the sidewall of the channel hole and the top surface of epitaxial portion 115, and semiconductor layer 117 is then deposited over memory film 116 and above epitaxial portion 115. The blocking layer, memory layer, and tunneling layer can be subsequently deposited in this order using one or more thin film deposition processes, such as ALD, CVD, PVD, any other suitable processes, or any combination thereof, to form memory film 116. Semiconductor layer 117 can then be deposited on the tunneling layer using one or more thin film deposition processes, such as ALD, CVD, PVD, any other suitable processes, or any combination thereof. In some embodiments, dielectric core 118 is filled in the remaining space of the channel hole by depositing dielectric materials after the deposition of semiconductor layer 117, such as silicon oxide.

In some embodiments, drain structure 120 is formed in the upper portion of each channel hole. In some embodiments, parts of memory film 116, semiconductor layer 117, and dielectric core 118 on the top surface of stack structure 11 and in the upper portion of each channel hole can be removed by CMP, grinding, wet etching, and/or dry etching to form a recess in the upper portion of the channel hole so that a top surface of semiconductor channel may be between the top surface and the bottom surface of dielectric cap layer 155. Drain structure 120 then can be formed by depositing conductive materials, such as metals, into the recess by one or more thin film deposition processes, such as CVD, PVD, ALD, electroplating, electroless plating, or any combination thereof. A channel structure 140 is thereby formed. A plurality of memory cells may subsequently be formed by the intersection of semiconductor channels 119 and control conductor layers 133. Optionally, a planarization process, e.g., dry/wet etch and/or CMP, is performed to remove any excess material on the top surface of stack structure 111.

In some embodiments, Operation 1008 and Operation 1010 may be performed in a different order. For example, operation 1010 may be performed before Operation 1008. For example, a channel structure in each of the at least one channel hole may be formed before forming the support structure and the support pillar. For example, at 1006, a sacrificial structure may be formed in each of the at least one support hole 107 and at least one pillar hole 106. After forming the channel structure 140 in each of the at least one channel hole 105, support structures 112 and support pillars 113 may be formed respectively in each of the at least one support hole 107 and the at least one pillar hole 106 by removing the sacrificial structure in each of the at least one support hole 107 and the at least one pillar hole 106.

Figure 6:
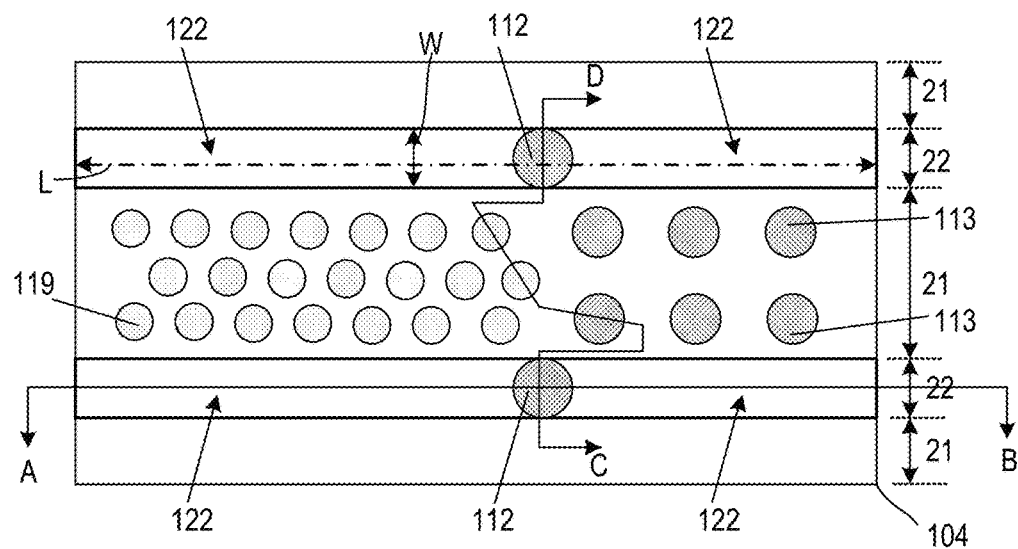
FIG. 6 illustrates a plan view of the exemplary 3D memory device at another stage of the fabrication process, according to some embodiments of the present disclosure.
Figure 6:

Referring back to FIG. 10A, portions of the stack structure in source regions may be removed to form at least one slit structure extending laterally and vertically (Operation 1012). FIG. 6 illustrates a corresponding structure 600. As shown in FIG. 6, a slit structure 122 may be formed in source region 22 extending laterally along the x-direction. A plurality of interleaved sacrificial layers and insulating layers 104 may be formed in each block region 21. Slit structure 122 may extend vertically along the z-direction, exposing substrate 100. One or more support structures 112 may be distributed along the x-direction in source region 22, dividing the respective slit structure 122 into a plurality of slit openings. Sidewalls of support structure 112 may be in contact with slit structure 122, e.g., along the x-direction. Support structure 112 may be in contact with at least one sidewall of slit structure 122 (i.e., at least one adjacent block region 21 of stack structure 111). In some embodiments, support structure 112 is in contact with both sidewalls of slit structure 122. That is, support structure 112 may be in contact with both adjacent block regions 21 along the y-direction. A width of support structure 112 along the y-direction may be less than, equal to, or greater than the width of the respective slit structure 122 along the y-direction. FIG. 9 illustrates an enlarged plan view 900 of support structure 112 and slit structure 122. As shown in FIG. 9, a width d2 of support structure 112 along the y-direction is equal to or greater than a width d1 of slit structure 122 along the y-direction. In some embodiments, d2 is greater than d1. In some embodiments, support structure 112 is in contact with at least one adjacent block region 21 during the formation of slit structure 122. That is, support structures 112 may provide support to the adjacent block region 21 during the formation of slit structures 122 and subsequent formation of source structures to prevent slit structure 122 (e.g., block regions 21) from deformation. In some embodiments, d2 is equal to or greater than d1 and support structure 112 is in contact with both adjacent block regions 21 during the formation of slit structure 122 and the source structure, providing support to stack structure 111. In some embodiments, support structures 112 is used as an etch mask and an anisotropic etching process, e.g., dry etch, is performed to remove portions of stack structure 111 in source region 22 to form slit structure 122. Portions of stack structure 111 around (e.g., adjacent to) each support structure 112 may be removed to expose substrate 100, forming slit structure 122. An anisotropic etching process, e.g., dry etch, may be performed to form slit structures 122.

Figure 7A:
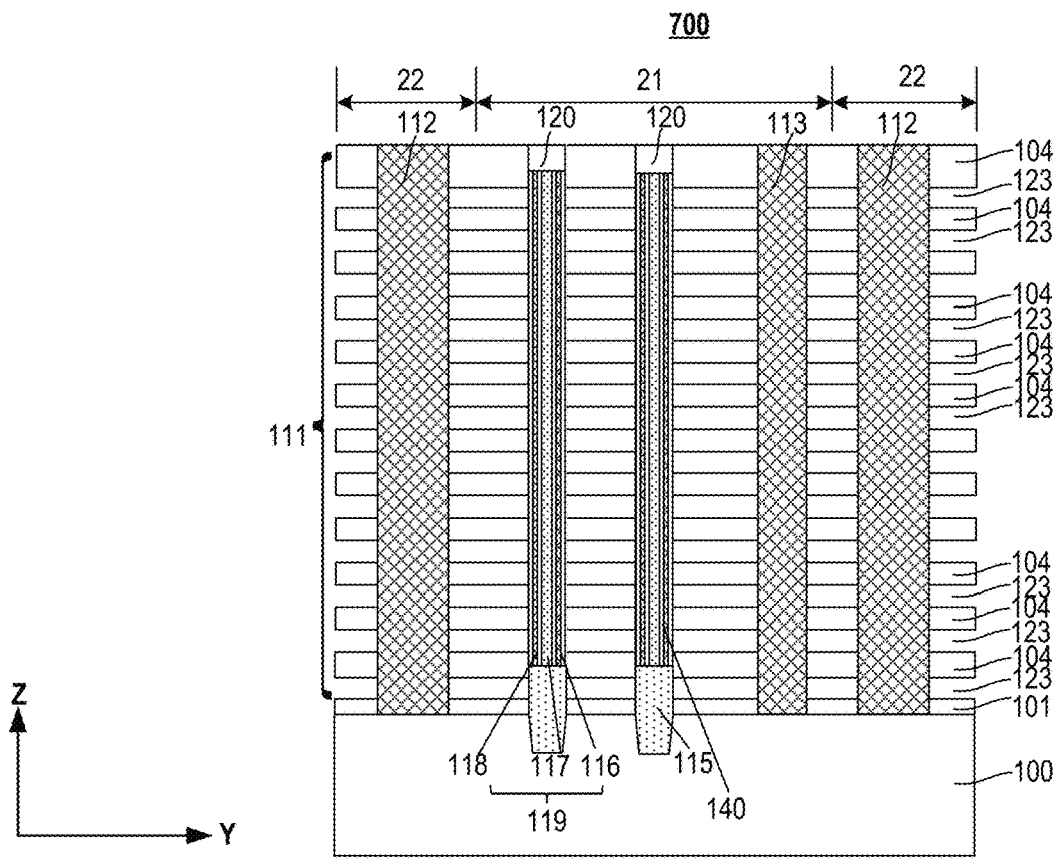
FIG. 7A illustrates a cross-sectional view of the 3D memory device illustrated in FIG. 6 along the C-D direction, at another stage of the fabrication process, according to some embodiments of the present disclosure.
Figure 7B:
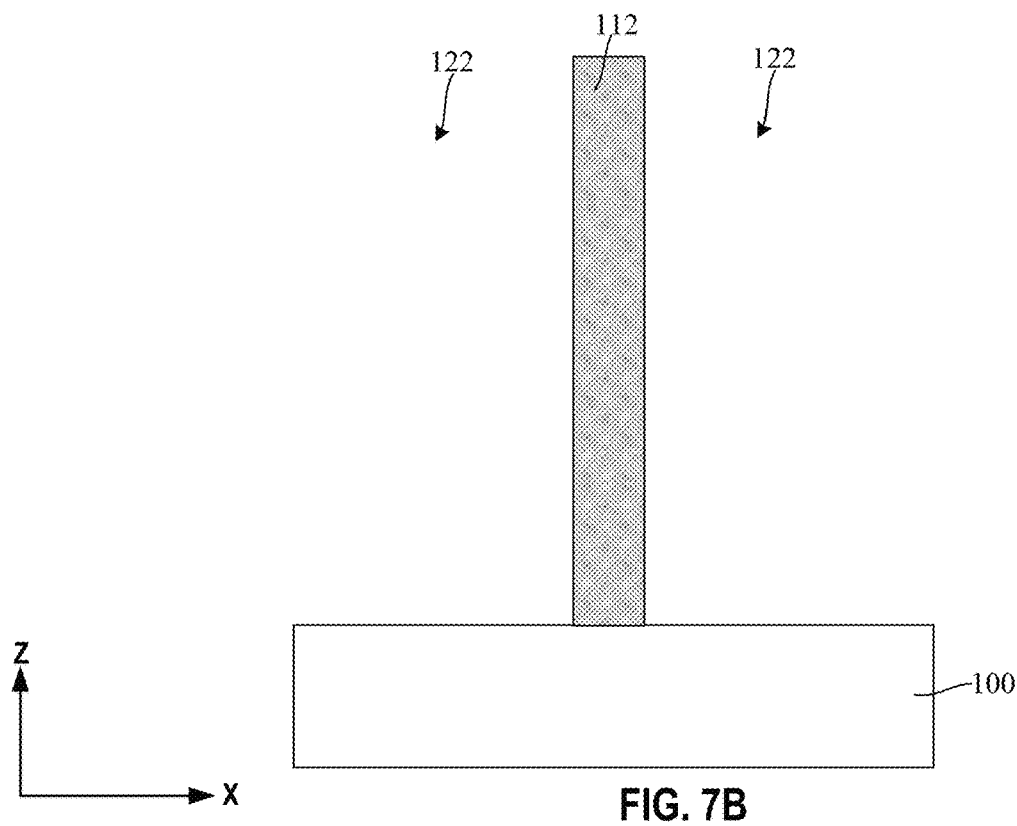
FIG. 7B illustrates a cross-sectional view of the 3D memory device illustrated in FIG. 6 along the A-B direction, at another stage of the fabrication process, according to some embodiments of the present disclosure.
Figure 7C:
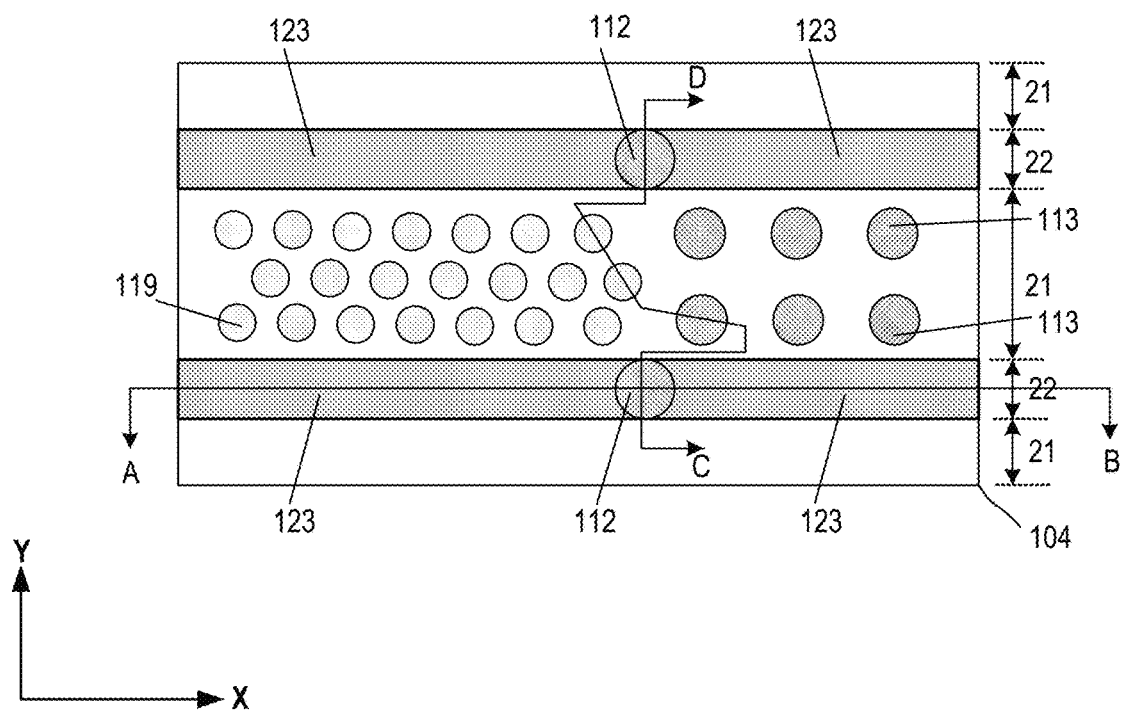
FIG. 7C illustrates a plan view of the exemplary 3D memory device at another stage of the fabrication process, according to some embodiments of the present disclosure.
Figure 7D:
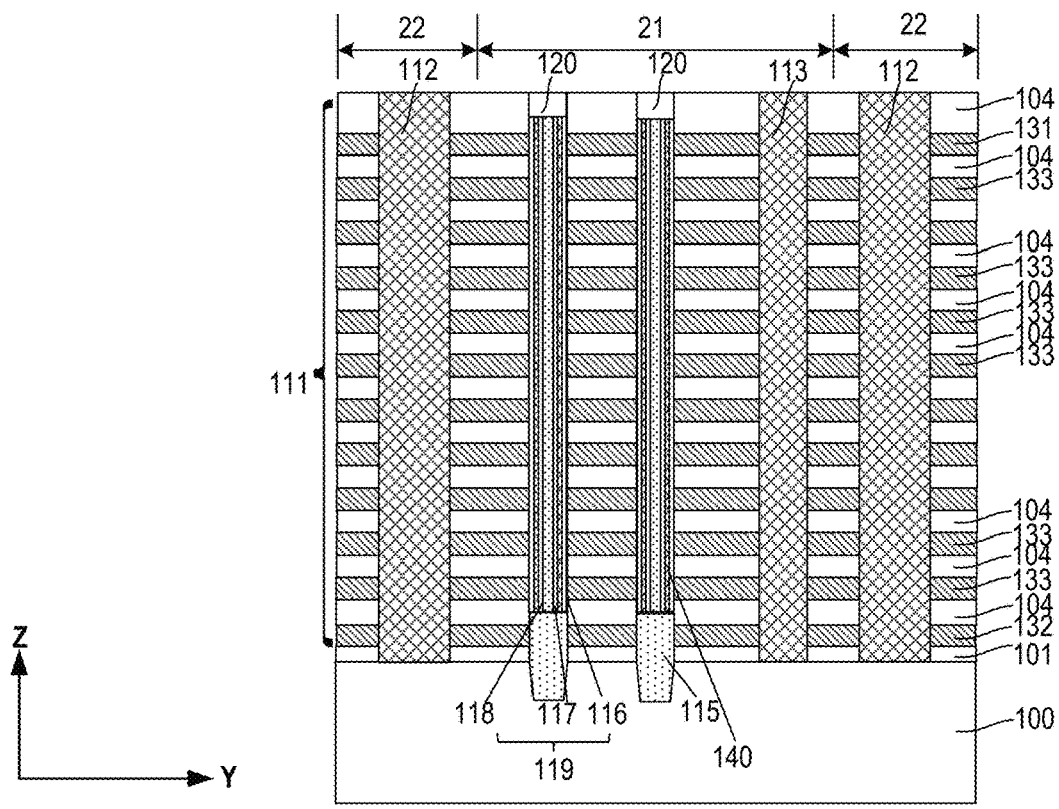
FIG. 7D illustrates a cross-sectional view of the 3D memory device illustrated in FIG. 7C along the C-D direction, according to some embodiments of the present disclosure.
Figure 7E:
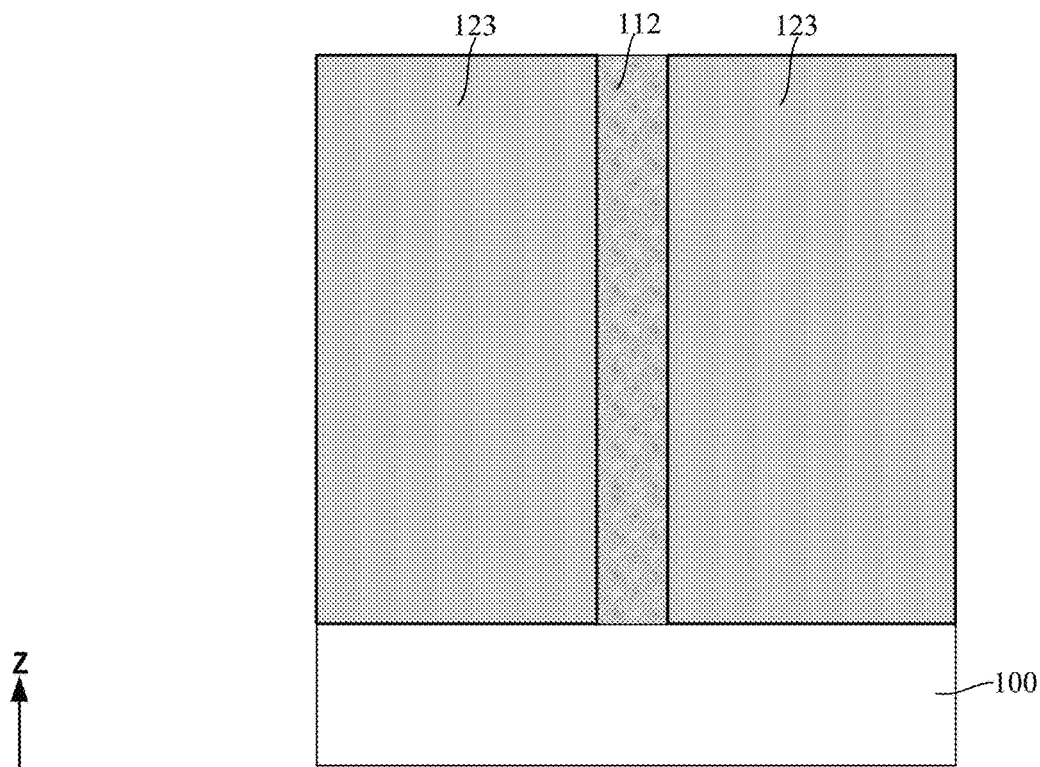
FIG. 7E illustrates a cross-sectional view of the 3D memory device illustrated in FIG. 7C along the A-B direction, according to some embodiments of the present disclosure.
Figure 8A:
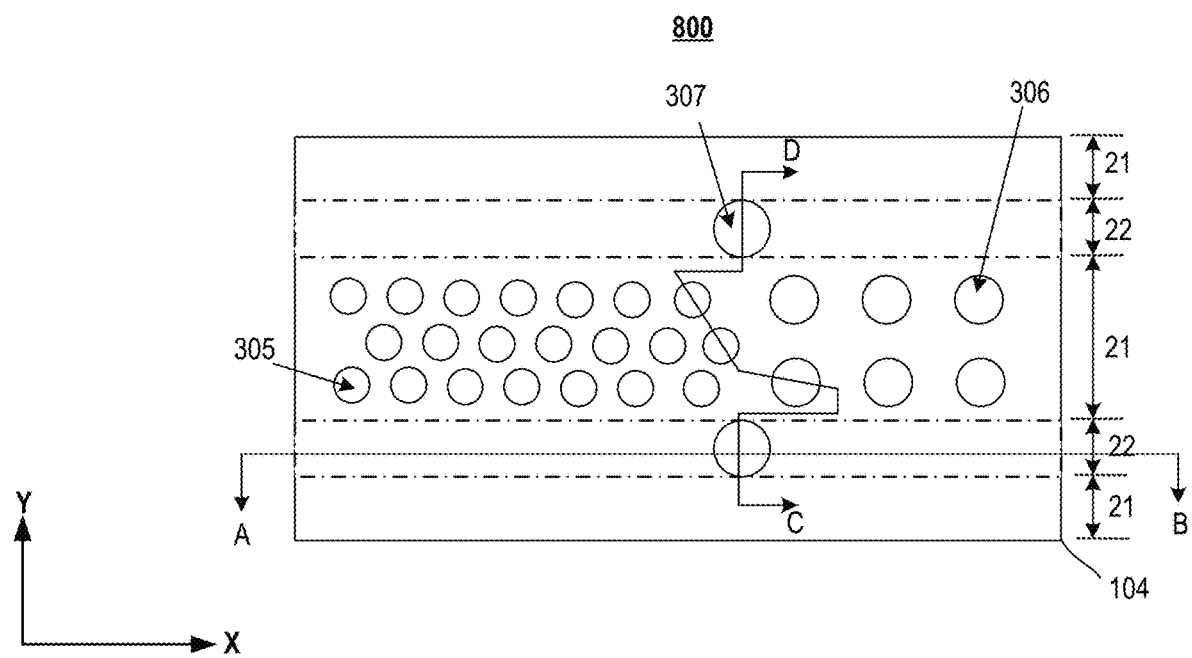
FIG. 8A illustrates a plan view of another exemplary 3D memory device with support structures in GLSs, according to some embodiments of the present disclosure.
Figure 8B:
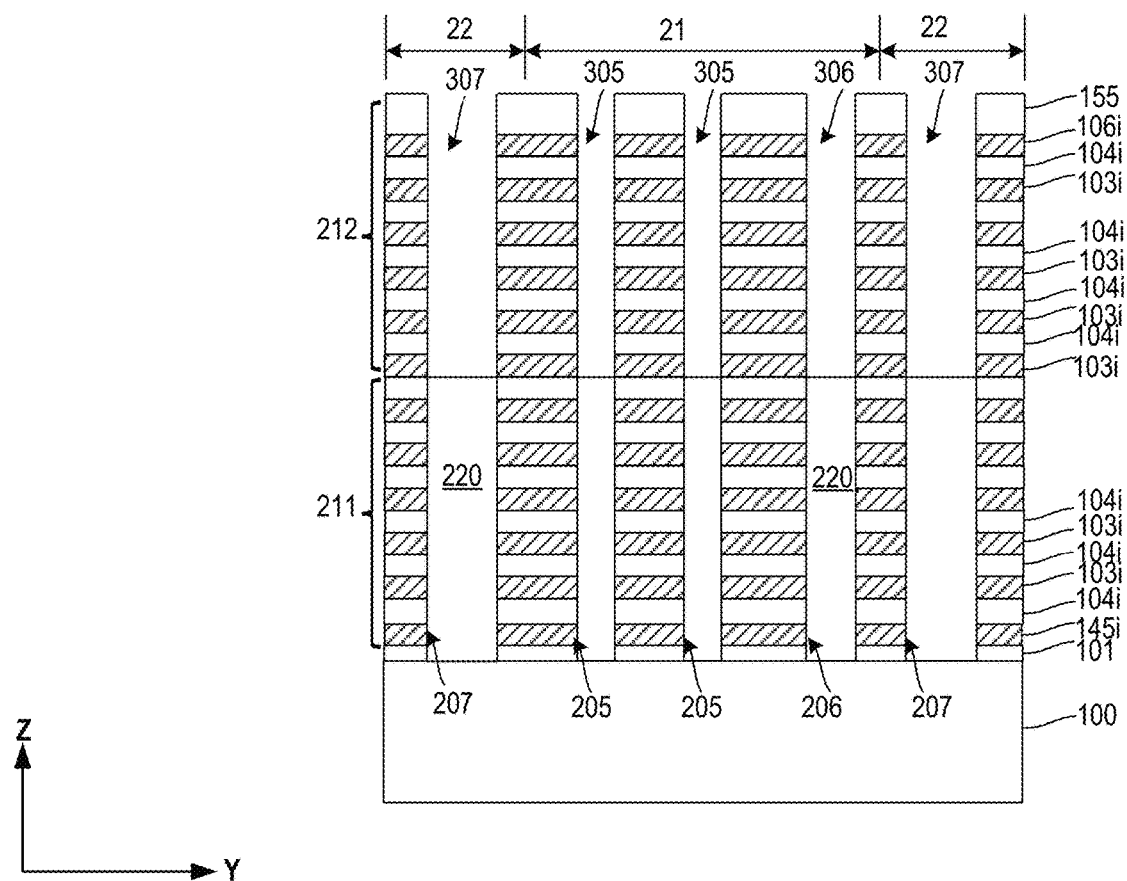
FIG. 8B illustrates a cross-sectional view of the 3D memory device illustrated in FIG. 8A along the C-D direction, according to some embodiments of the present disclosure.
Figure 8C:
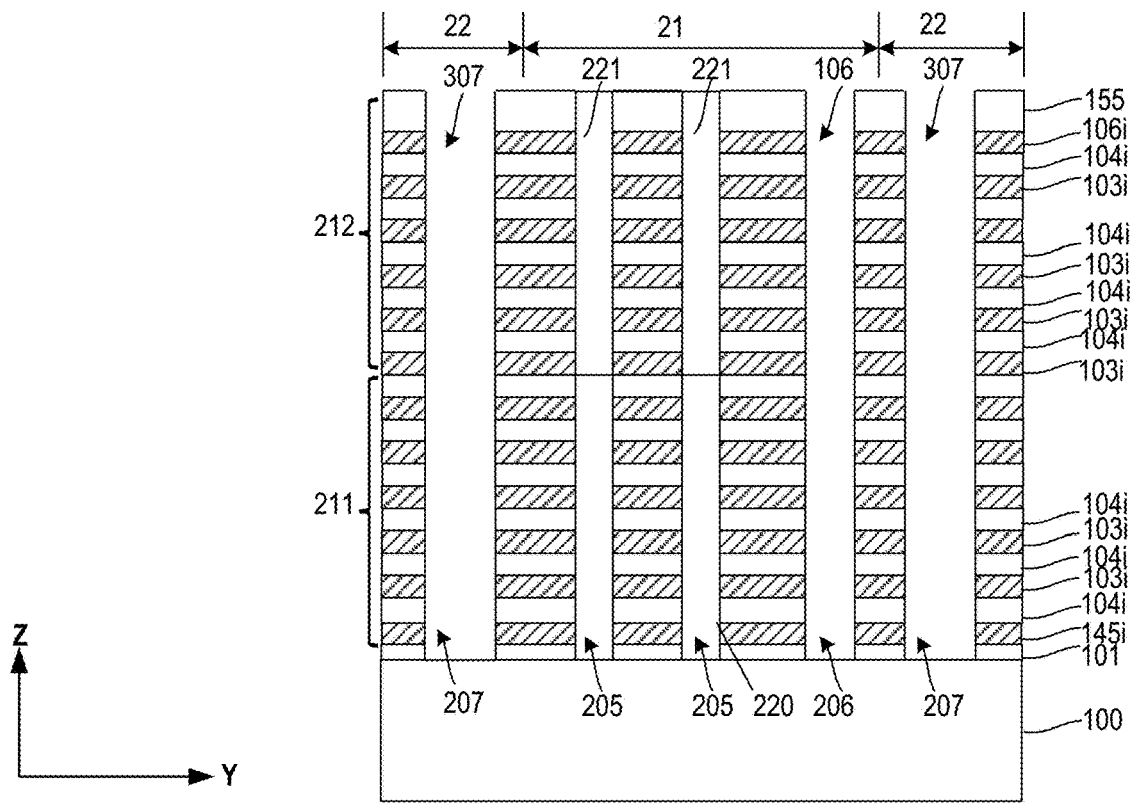
FIG. 8C illustrates another stage of the fabrication process in the cross-sectional view of the 3D memory device illustrated in FIG. 8A along the A-B direction, according to some embodiments of the present disclosure.
Figure 8D:
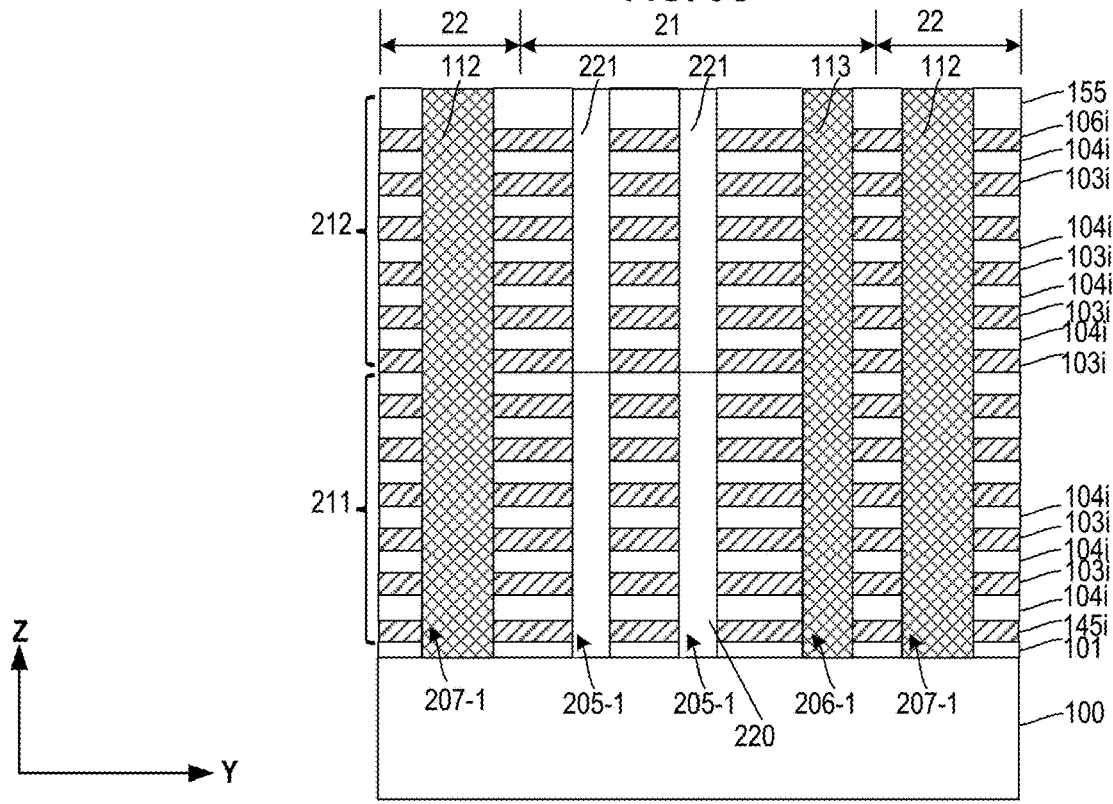
FIG. 8D illustrates another stage of the fabrication process in the cross-sectional view of the 3D memory device illustrated in FIG. 8A along the C-D direction, according to some embodiments of the present disclosure.
Figure 8E:
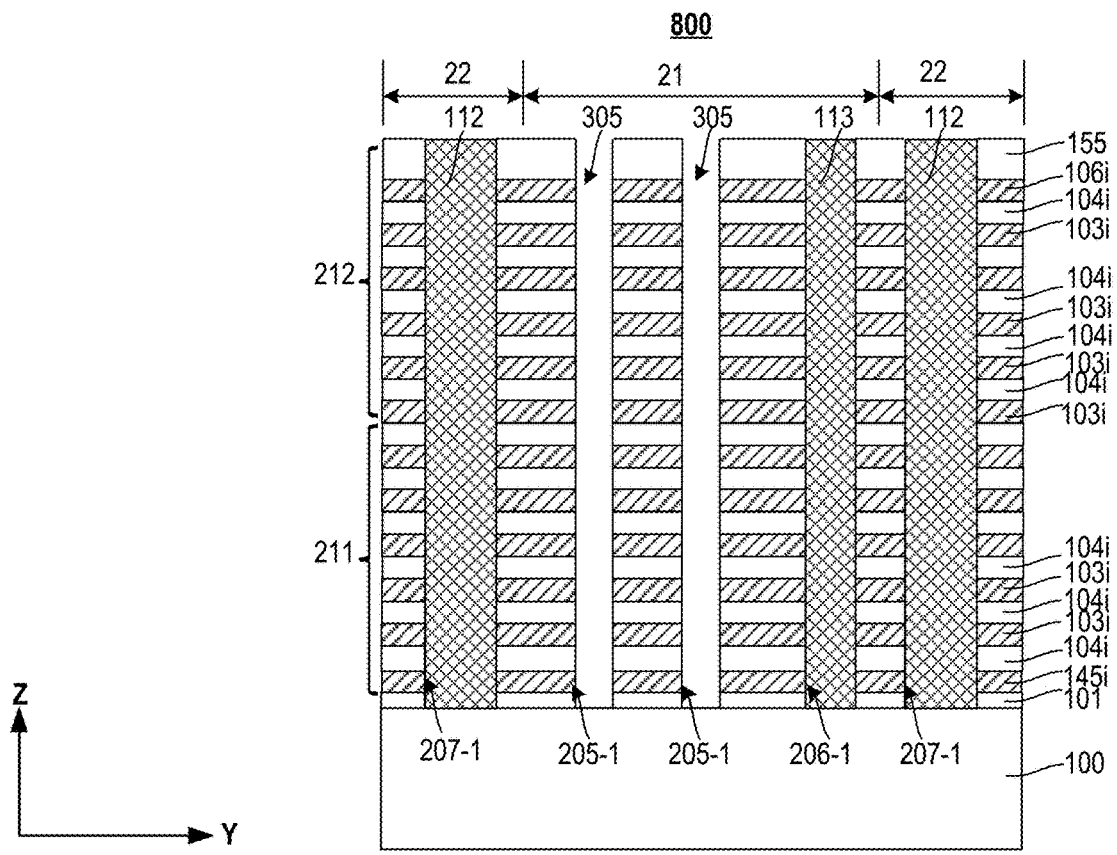
FIG. 8E illustrates another stage of the fabrication process in the cross-sectional view of the 3D memory device illustrated in FIG. 8A along the C-D direction, according to some embodiments of the present disclosure.
Figure 8F:
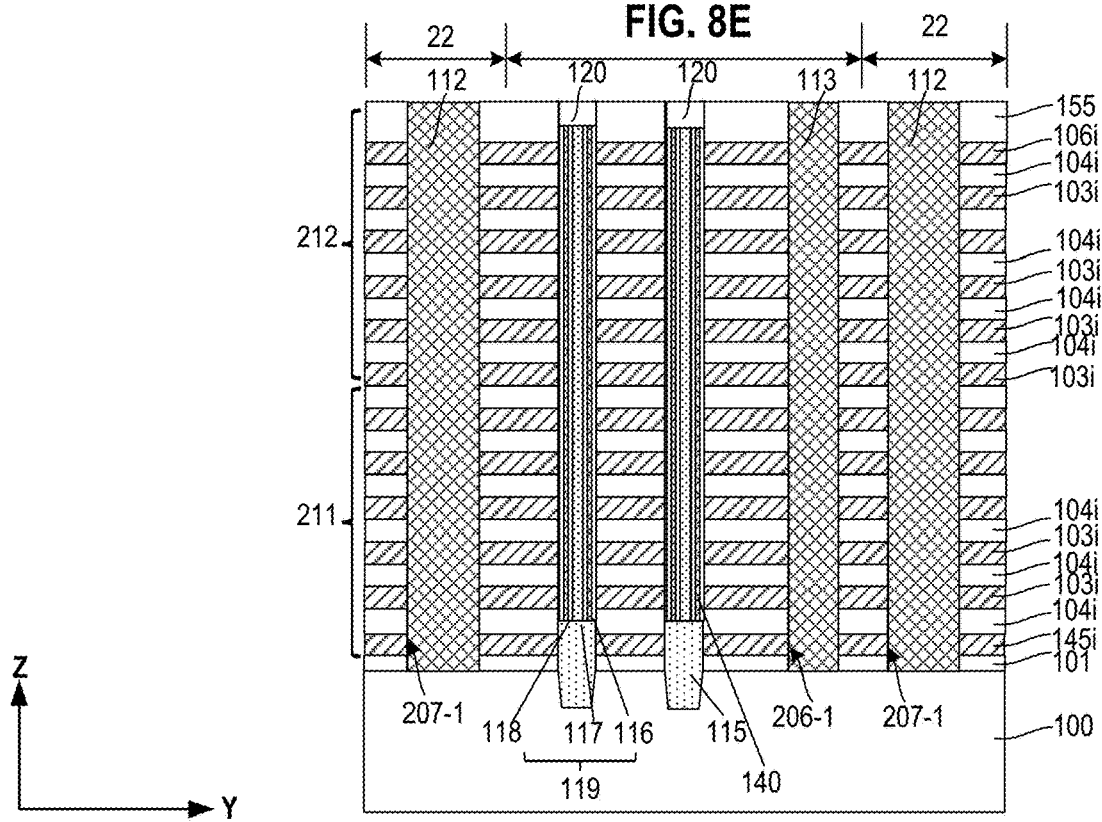
FIG. 8F illustrates another stage of the fabrication process in the cross-sectional view of the 3D memory device illustrated in FIG. 8A along the C-D direction, according to some embodiments of the present disclosure.

Referring back to FIG. 10A, a source structure is formed in each slit structure, and a plurality of conductor layers and a plurality of memory blocks are formed (Operation 1014). FIGS. 7A-7E illustrate a corresponding structure 700. As shown in FIGS. 7A and 7B, sacrificial layers retained in block region 21 from the formation of slit structures 122 may be removed to form a plurality of lateral recesses. As shown in FIGS. 7C-7E, a suitable conductor material may be deposited to fill up the lateral recesses, in block region 21, to form a plurality of conductor layers (e.g., 131-133) and another suitable conductor material may be deposited to fill up the lateral recesses, in source region 22 to form a plurality of source structure.

In some embodiments, initial sacrificial layers (e.g., 103i, 106i, and 145i) in block regions 21 are removed to form a plurality of lateral recesses, and a suitable conductor material is deposited to fill up the lateral recesses, forming a plurality of conductor layers (e.g., 131-133) in block regions 21. Control conductor layers 133 may intersect with semiconductor channels 119 and form a plurality of memory cells in block region 21, which forms a memory block. In some embodiments, the top sacrificial layer in the block regions may form a top conductor layer 131, and the bottom sacrificial layer in the block regions may form a bottom conductor layer 132.

The conductor material may include one or more of tungsten, aluminum, copper, cobalt, silicides, and polysilicon. A suitable isotropic etching process, e.g., wet etch, can be performed to remove sacrificial layers and sacrificial portions, and form the plurality of lateral recesses. A suitable deposition process, such as CVD, PVD, ALD, and/or sputtering can be performed to deposit the conductor material into the lateral recesses to form conductor layers (e.g., 131-133).

As shown in FIGS. 7C-7E, an insulating structure 137 may be formed in each slit structure 122, and a source contact 123 may be formed in the respective insulating structure. The insulating structures 137 and source contacts 123 in each source region 22 may form a source structure. Insulating structure 137 and source contacts 123 may be formed on each side of support structure 112 along the x-direction. Support structure 112 may separate adjacent source contacts 123 and insulating structures 137 along the x-direction and may be in contact with at least one adjacent memory block along the y-direction. In some embodiments, insulating structures 137 includes silicon oxide, and is deposited by one or more of CVD, PVD, ALD, and sputtering. A recess etch may be performed to remove portions of insulating structures 137 at the bottom of the respective slit structure 122 to expose substrate 100. In some embodiments, source contacts 123 include one or more of tungsten, aluminum, copper, cobalt, silicides, and polysilicon, and a suitable deposition process, e.g., one or more of CVD, PVD, ALD, and sputtering, is performed to deposit source contacts 123 into respective slit structures 122.

Figure 10B:
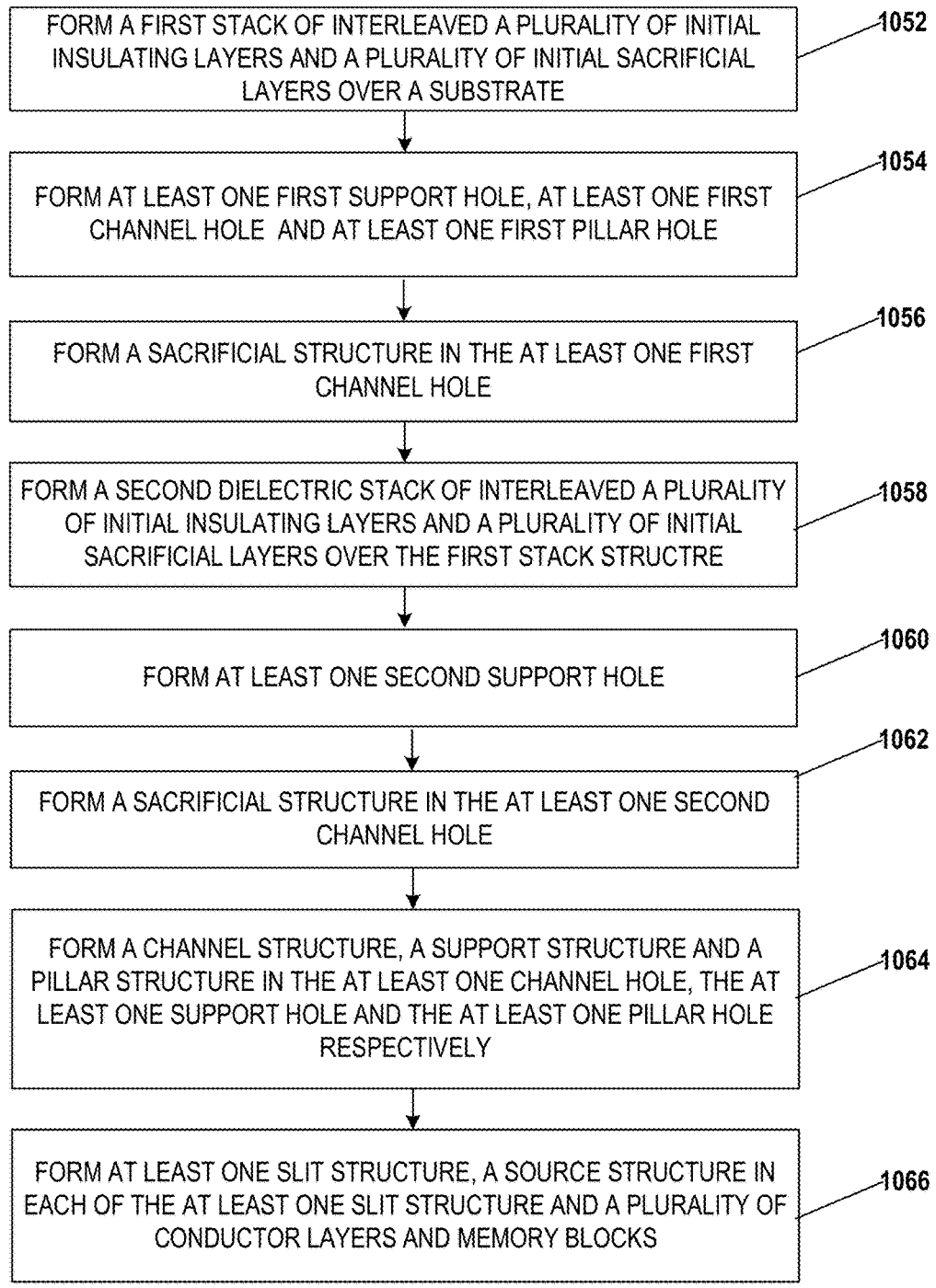
FIG. 10B illustrates a flowchart of another exemplary fabrication process for forming a 3D memory device with support structures in slit structures, according to some embodiments of the present disclosure.

FIGS. 8A-8F illustrate another fabrication process to form 3D memory device 800, and FIG. 10B illustrates a flowchart 1050 of the fabrication process, according to some embodiments. Different from the fabrication process illustrated in FIGS. 1-7, two stack structures of interleaved a plurality of initial insulating layers and a plurality of initial sacrificial layers are formed. For ease of illustration, same or similar operations illustrated in FIGS. 1-7 are not repeated in the description.

At the beginning of the process, a first stack structure 211 of interleaved a plurality of initial insulating layers and a plurality of initial sacrificial layers are formed (Operation 1052). This operation may be similar to Operation 1002 in method 1000.

At Operation 1054, at least one first support hole 207 extending vertically in the first stack structure 211 and into substrate 100 are formed and at least one first channel hole 205 and at least one first pillar hole 206 are formed in the plurality of block regions by the same operation that forms the at least one first support hole 207 on the first dielectric stack. This operation may be similar to Operation 1004 in method 1000.

At Operation 1056, a sacrificial structure 220 is formed in each of the at least one least one first support hole 207, the at least one first channel hole 205 and the at least one first pillar hole 206 respectively. Sacrificial structure 220 may be formed by filling each of the at least one first support hole 207, the at least one first channel hole 205 and the at least one first pillar hole 206 with sacrificial materials. The formation of sacrificial structures 220 may be referred to Operation 1006 in method 1000. Optionally, a planarization process (e.g., CMP and/or recess etching) is performed to remove any excess dielectric material from the deposition process for a second stack structure 212 to be formed on the first stack structure 211.

At Operation 1058, a second stack structure 212 of interleaved a plurality of initial insulating layers and a plurality of initial sacrificial layers are formed on first stack structure 211. This operation may be similar to Operation 1002 in method 1000.

At Operation 1060, at least one second support hole 307 extending vertically in stack structure 212 is formed. At least one second channel hole 305 and at least one second pillar hole 306 may be formed in second stack structure 212 by the same operation that forms at least one second support hole 307. In some embodiments, each second support hole 307 is vertically aligned with a corresponding first support hole 207 in first stack structure 211 along the z-direction. A bottom of second support hole 307 may expose sacrificial structure 220 formed in the corresponding first support hole 207. Also, each second channel hole 305 is vertically aligned with a corresponding first channel hole 205 and exposes the corresponding sacrificial structure 220 formed in the corresponding first channel hole. Each second pillar hole 306 is vertically aligned with a corresponding first pillar hole 206 and exposes the corresponding sacrificial structure formed in the corresponding first pillar hole 206.

At Operation 1062, a sacrificial structure 221 is formed in each of at least one second channel hole 305. The Operation may be similar to Operation 1006. Thus, the same sacrificial structure is formed in second channel hole 305 and first channel hole 205. The second channel hole 305 and first channel hole 205 may form a channel hole 205-1.

Sacrificial material in at least one first support hole 207 and at least one first pillar hole 206 are removed. Thus, second support hole 307 is connected with first support hole 207 and the connected second support hole 307 and first support hole 207 may form a support hole 207-1. Second pillar hole 306 is connected with first pillar hole 206 and the connected second pillar hole 306 and first pillar hole 206 may form a pillar hole 206-1 similar to pillar hole 106 in method 1000.

At Operation 1064, channel structures 140, at least one support structure 112 and at least one support pillars 113 may be formed in channel hole 205-1, support hole 207-1 and pillar hole 206-1 respectively, in Operations similar to Operation 1008 and Operation 1010.

At Operation 1066, at least one slit structure, a source structure in each of the at least one slit structure, a plurality of conductor layers and a plurality of memory blocks are formed in Operations similar to Operation 1012 and Operation 1014.

In some embodiments, a 3D memory device includes a stack structure and at least one source structure extending vertically and laterally and dividing the stack structure into a plurality of block regions. The stack structure may include a plurality of conductor layers and a plurality of insulating layers interleaved over a substrate. The at least one source structure includes at least one support structure extending along the vertical direction to the substrate, the at least one support structure being in contact with at least a sidewall of the respective source structure.

In some embodiments, the at least one support structure is each in contact with both adjacent block regions.

In some embodiments, each of the at least one source structure comprises at least one support structure extending along the vertical direction to the substrate.

In some embodiments, sidewalls of the at least one support structure are each in contact with the respective source structure.

In some embodiments, along a lateral direction perpendicular to another lateral direction along which the at least one support structure extends, a width of each of the at least one support structure is greater than or equal to a width of the source structure.

In some embodiments, the at least one support structure comprises at least one of silicon oxide or polysilicon.

In some embodiments, the 3D memory device further includes a least one channel structure extending vertically in the stack structure in at least one of the plurality of block regions, wherein the at least one channel structure includes an epitaxial portion, a semiconductor channel, and a drain structure. The epitaxial portion is in contact with and conductively connected to the substrate, a top surface of the epitaxial portion being between a top surface and a bottom surface of a bottom insulating layer. The semiconductor channel is in contact with and conductively connected to the epitaxial portion, the semiconductor channel comprising a blocking layer, a memory layer, a tunneling layer, a semiconductor layer, and a dielectric core arranged radially from a sidewall of the semiconductor channel towards a center of the semiconductor channel. The drain structure in contact with and conductively connected to the semiconductor channel.

In some embodiments, the 3D memory device further includes at least one support pillar extending vertically in the stack structure in the at least one of the plurality of block regions, wherein the at least one support pillar comprises the same material as the at least one support structure.

In some embodiments, a method for forming a 3D memory device includes forming a dielectric stack including interleaved a plurality of initial insulating layers and a plurality of initial sacrificial layers over a substrate, forming at least one slit structure extending vertically and laterally in the dielectric stack, the at least one slit structure dividing the dielectric stack into a plurality of block regions, wherein the at least one slit structure comprises at least one support structure extending along the vertical direction to the substrate and being in contact with at least one adjacent block region and forming a source structure in each of the at least one slit structure.

In some embodiments, forming the at least one slit structure includes forming at least one support hole extending vertically in the dielectric stack and into the substrate, filling the at least one support hole with a support material to form the at least one support structure, and removing portions of the stack structure to form the at least one slit structure extending laterally, a width of each of the at least one support structure being greater than or equal to a width of the respective slit structure along a lateral direction perpendicular to another lateral direction along which the slit structure extends, sidewalls of the at least one slit structure in contact with the at least one slit structure.

In some embodiments, forming the source structure includes forming an insulating structure in each of the at least one slit structure, the insulating structure exposing the substrate and forming a source contact in the insulating structure, the source contact in contact with and conductively connected to the substrate.

In some embodiments, the method for forming a 3D further includes forming at least one channel hole in the plurality of block regions by a same operation that forms the at least one support hole and filling the at least one channel hole with a sacrificial material.

In some embodiments, the method for forming a 3D further includes forming at least one pillar hole by the same operation that forms the at least one support hole and filling the at least one pillar hole with the support material by the same operation that fills the at least one support hole.

In some embodiments, the method for forming a 3D further includes forming the dielectric stack comprises forming a first dielectric stack and a second dielectric stack and forming the at least one support structure. Forming the at least one support structure further includes forming, before a formation of the second dielectric deck, at least one first support hole extending vertically in the first dielectric stack and into the substrate, filling the at least one first support hole with a sacrificial material, forming the second dielectric stack over the first dielectric stack, forming at least one second support hole extending vertically in the second dielectric stack and exposing the sacrificial material in the respective first support hole, removing the sacrificial material to expose the substrate and form at least one support hole and filling the at least one support hole with a support material.

In some embodiments, the method for forming a 3D further includes forming at least one first channel hole in the plurality of block regions by a same operation that forms the at least one first support hole, filling the at least one first channel hole with the sacrificial material by a same operation that fills the at least one first support hole, forming at least one second channel hole extending vertically in the second dielectric stack and exposing the sacrificial material in the respective first channel hole and filling the at least one second channel hole with another sacrificial material.

In some embodiments, the method for forming a 3D further includes forming at least one first pillar hole by the same operation that forms the at least one first support hole, filling the at least one first pillar hole with the sacrificial material by the same operation that fills the at least one first support hole, forming at least one second pillar hole extending vertically in the second dielectric stack and exposing the sacrificial material in the respective first pillar hole, removing the sacrificial material to expose the substrate and form at least one pillar hole and filling the at least one pillar hole with the support material by the same operation that fills the at least one support hole.

In some embodiments, the method for forming a 3D further includes removing the other sacrificial material in the at least one second channel hole and the sacrificial material in the at least one first channel hole to expose the substrate and form at least one channel hole and forming a channel structure in each of the at least one channel hole.

In some embodiments, the method for forming a 3D further includes removing a plurality of sacrificial layers in each of the plurality of block regions to form a plurality of lateral recesses, forming a plurality of conductor layers in the plurality of lateral recesses.

In some embodiments, forming the source structure further includes forming an insulating structure in each of the at least one slit structure and forming a source contact in the insulating structure and in contact with the substrate.

In some embodiments, a method for forming a 3D memory device includes forming a dielectric stack including interleaved a plurality of initial insulating layers and a plurality of initial sacrificial layers over a substrate, forming at least one support structure extending along the vertical direction to the substrate in each of a plurality of source regions, forming a plurality of slit structures extending vertically and laterally in the dielectric stack, the plurality of slit structures dividing the dielectric stack into a plurality of block regions, wherein the plurality of slit structure comprises the at least one support structure, and wherein the at least one support structure is in contact with at least one adjacent block region and forming a source structure in each of the at least one slit structure.

In some embodiments, forming the at least one support structure and forming the plurality of slit structures further includes forming at least one support hole extending vertically in the dielectric stack and into the substrate, filling the at least one support hole with a support material to form the at least one support structure and removing portions of the stack structure to form the at least one slit structure extending laterally, a width of each of the at least one support structure being greater than or equal to a width of the respective slit structure along a lateral direction perpendicular to another lateral direction along which the slit structure extends, the at least one support structure in contact with the at least one adjacent block region.

In some embodiments, the method for forming a 3D memory device further includes forming an insulating structure in each of the at least one slit structure, the insulating structure exposing the substrate and forming a source contact in the insulating structure, the source contact in contact with and conductively connected to the substrate.

In some embodiments, the method for forming a 3D memory device further includes forming at least one channel hole in the plurality of block regions by a same operation that forms the at least one support hole and filling the at least one channel hole with a sacrificial material.

In some embodiments, the method for forming a 3D memory device further includes forming at least one pillar hole by the same operation that forms the at least one support hole and filling the at least one pillar hole with the support material by the same operation that fills the at least one support hole.

In some embodiments, the method for forming a 3D memory device further includes removing the sacrificial material in the at least one channel hole to expose the substrate and forming a channel structure in each of the at least one channel hole.

In some embodiments, the method for forming a 3D memory device further includes forming the dielectric stack comprises forming a first dielectric stack and a second dielectric stack and forming the at least one support structure. Forming the at least one support structure further includes forming, before a formation of the second dielectric deck, at least one first support hole extending vertically in the first dielectric stack and into the substrate, filling the at least one first support hole with a sacrificial material, forming the second dielectric stack over the first dielectric stack, forming at least one second support hole extending vertically in the second dielectric stack and exposing the sacrificial material in the respective first support hole, removing the sacrificial material to expose the substrate and form at least one support hole and filling the at least one support hole with a support material.

In some embodiments, the method for forming a 3D memory device further includes forming at least one first channel hole in the plurality of block regions by a same operation that forms the at least one first support hole, filling the at least one first channel hole with the sacrificial material by a same operation that fills the at least one first support hole, forming at least one second channel hole extending vertically in the second dielectric stack and exposing the sacrificial material in the respective first channel hole and filling the at least one second channel hole with another sacrificial material.

In some embodiments, the method for forming a 3D memory device further includes forming at least one first pillar hole by the same operation that forms the at least one first support hole, filling the at least one first pillar hole with the sacrificial material by the same operation that fills the at least one first support hole, forming at least one second pillar hole extending vertically in the second dielectric stack and exposing the sacrificial material in the respective first pillar hole, removing the sacrificial material to expose the substrate and form at least one pillar hole and filling the at least one pillar hole with the support material by the same operation that fills the at least one support hole.

In some embodiments, the method for forming a 3D memory device further includes removing the other sacrificial material in the at least one second channel hole and the sacrificial material in the at least one first channel hole to expose the substrate and form at least one channel hole and forming a channel structure in each of the at least one channel hole.

In some embodiments, the method for forming a 3D memory device further includes removing a plurality of sacrificial layers in each of the plurality of block regions to form a plurality of lateral recesses and forming a plurality of conductor layers in the plurality of lateral recesses.

In some embodiments, the method for forming a 3D memory device further includes forming an insulating structure in each of the at least one slit structure and forming a source contact in the insulating structure and in contact with the substrate.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments but should be defined only in accordance with the following claims and their equivalents.

What is claimed is:

1. A three-dimensional (3D) memory device, comprising:
   a stack structure comprising a plurality of conductor layers and a plurality of insulating layers interleaved over a substrate; and
   at least one source structure extending vertically and laterally and dividing the stack structure into a plurality of block regions,
   wherein the at least one source structure comprises at least one support structure extending along the vertical direction to the substrate, the at least one support structure being in contact with at least one adjacent block region, and the at least one support structure having a multi-layer structure.

2. The 3D memory device of claim 1, wherein the at least one support structure is each in contact with both adjacent block regions.

3. The 3D memory device of claim 2, wherein each of the at least one source structure comprises at least one support structure extending along the vertical direction to the substrate.

4. The 3D memory device of claim 3, wherein sidewalls of the at least one support structure are each in contact with the respective source structure.

5. The 3D memory device of claim 4, wherein along a lateral direction perpendicular to another lateral direction along which the at least one support structure extends, a width of each of the at least one support structure is greater than or equal to a width of the source structure.

6. The 3D memory device of claim 1, wherein the at least one support structure comprises at least one of silicon oxide or polysilicon.

7. The 3D memory device of claim 6, further comprising at least one channel structure extending vertically in the stack structure in at least one of the plurality of block regions, wherein the at least one channel structure comprises:
   an epitaxial portion in contact with and conductively connected to the substrate, a top surface of the epitaxial portion being between a top surface and a bottom surface of a bottom insulating layer of the plurality of insulating layers;
   a semiconductor channel in contact with and conductively connected to the epitaxial portion, the semiconductor channel comprising a blocking layer, a memory layer, a tunneling layer, a semiconductor layer, and a dielectric core arranged radially from a sidewall of the semiconductor channel towards a center of the semiconductor channel; and
   a drain structure in contact with and conductively connected to the semiconductor channel.

8. The 3D memory device of claim 7, further comprising at least one support pillar extending vertically in the stack structure in the at least one of the plurality of block regions, wherein the at least one support pillar comprises the same material as that of the at least one support structure.

9. A method for forming a three-dimensional (3D) memory device, comprising:
   forming a dielectric stack comprising interleaved a plurality of initial insulating layers and a plurality of initial sacrificial layers over a substrate;
   forming at least one support hole and at least one channel hole each extending along a vertical direction to the substrate by a same operation;
   forming at least one slit structure extending vertically and laterally in the dielectric stack, the at least one slit structure dividing the dielectric stack into a plurality of block regions, wherein the at least one slit structure comprises at least one support structure in the at least one support hole and being in contact with at least one adjacent block region; and
   forming a source structure in each of the at least one slit structure.

10. The method of claim 9, wherein forming the at least one slit structure comprises:
    filling the at least one support hole with a support material to form the at least one support structure; and
    removing portions of the dielectric stack to form the at least one slit structure extending laterally, a width of each of the at least one support structure being greater than or equal to a width of the respective slit structure along a lateral direction perpendicular to another lateral direction along which the slit structure extends, sidewalls of the at least one slit structure in contact with the at least one slit structure.

11. The method of claim 10, wherein forming the source structure comprises:
    forming an insulating structure in each of the at least one slit structure, the insulating structure exposing the substrate; and
    forming a source contact in the insulating structure, the source contact in contact with and conductively connected to the substrate.

12. The method of claim 10, further comprising:
    filling the at least one channel hole with a sacrificial material;
    removing the sacrificial material after a formation of the at least one support structure; and filling the at least one channel hole with a channel-forming structure.

13. The method of claim 9, wherein
forming the dielectric stack comprises forming a first dielectric stack and a second dielectric stack; and
forming the at least one support structure comprises:
   forming, before a formation of the second dielectric deck, at least one first support hole extending vertically in the first dielectric stack and into the substrate;
   filling the at least one first support hole with a sacrificial material;
   forming the second dielectric stack over the first dielectric stack;
   forming at least one second support hole extending vertically in the second dielectric stack and exposing the sacrificial material in the respective first support hole;
   removing the sacrificial material to expose the substrate and form at least one support hole; and
   filling the at least one support hole with a support material.

14. The method of claim 13, further comprising:
forming at least one first channel hole in the plurality of block regions by a same operation that forms the at least one first support hole;
filling the at least one first channel hole with the sacrificial material by a same operation that fills the at least one first support hole;
forming at least one second channel hole extending vertically in the second dielectric stack and exposing the sacrificial material in the respective first channel hole; and
filling the at least one second channel hole with another sacrificial material.

15. The method of claim 14, further comprising:
forming at least one first pillar hole by the same operation that forms the at least one first support hole;
filling the at least one first pillar hole with the sacrificial material by the same operation that fills the at least one first support hole;
forming at least one second pillar hole extending vertically in the second dielectric stack and exposing the sacrificial material in the respective first pillar hole;
removing the sacrificial material to expose the substrate and form at least one pillar hole; and
filling the at least one pillar hole with the support material by the same operation that fills the at least one support hole.

16. The method of claim 15, further comprising:
removing the other sacrificial material in the at least one second channel hole and the sacrificial material in the at least one first channel hole to expose the substrate and form at least one channel hole; and
forming a channel structure in each of the at least one channel hole.

17. The method of claim 16, further comprising:
removing a plurality of initial sacrificial layers in each of the plurality of block regions to form a plurality of lateral recesses; and
forming a plurality of conductor layers in the plurality of lateral recesses.

18. The method of claim 17, wherein forming the source structure comprises:
forming an insulating structure in each of the at least one slit structure; and
forming a source contact in the insulating structure and in contact with the substrate.

19. A method for forming a three-dimensional (3D) memory device, comprising:
forming a dielectric stack comprising interleaved a plurality of initial insulating layers and a plurality of initial sacrificial layers over a substrate;
forming at least one support structure extending along the vertical direction to the substrate in each of a plurality of source regions, the at least one support structure having a multi-layer structure;
forming a plurality of slit structures extending vertically and laterally in the dielectric stack, the plurality of slit structures dividing the dielectric stack into a plurality of block regions, wherein the plurality of slit structure comprises the at least one support structure, and wherein the at least one support structure is in contact with at least one adjacent block region; and
forming a source structure in each of the plurality of slit structures.

20. The method of claim 19, wherein forming the at least one support structure and forming the plurality of slit structures comprise:
forming at least one support hole extending vertically in the dielectric stack and into the substrate;
filling the at least one support hole with a support material to form the at least one support structure; and
removing portions of the dielectric stack to form the plurality of slit structures extending laterally, a width of each of the at least one support structure being greater than or equal to a width of the respective slit structure along a lateral direction perpendicular to another lateral direction along which the slit structure extends, the at least one support structure in contact with the at least one adjacent block region.

* * * * *